(12) United States Patent
Ichijo et al.

(10) Patent No.: US 7,855,153 B2
(45) Date of Patent: Dec. 21, 2010

(54) METHOD FOR MANUFACTURING SEMICONDUCTOR DEVICE

(75) Inventors: Mitsuhiro Ichijo, Zama (JP); Kenichi Okazaki, Tochigi (JP); Tetsuhiro Tanaka, Tochigi (JP); Takashi Ohtsuki, Hadano (JP); Seiji Yasumoto, Tochigi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/364,544

(22) Filed: Feb. 3, 2009

(65) Prior Publication Data

US 2009/0203174 A1    Aug. 13, 2009

(30) Foreign Application Priority Data

Feb. 8, 2008    (JP)    ............................. 2008-029086

(51) Int. Cl.
*H01L 21/31*    (2006.01)
*H01L 21/469*    (2006.01)

(52) U.S. Cl. ........................ 438/772; 438/762; 438/777; 438/786; 257/E21.267

(58) Field of Classification Search ................. 438/762, 438/772, 777, 786, FOR. 395, FOR. 401; 257/E21.267
See application file for complete search history.

(56) References Cited

U.S. PATENT DOCUMENTS

| | | | |
|---|---|---|---|
| 5,729,308 A | 3/1998 | Yamazaki et al. | |
| 5,763,899 A | 6/1998 | Yamazaki et al. | |
| 6,278,131 B1 | 8/2001 | Yamazaki et al. | |
| 6,399,520 B1 | 6/2002 | Kawakami et al. | |
| 6,417,896 B1 | 7/2002 | Yamazaki et al. | |
| 6,914,642 B2 | 7/2005 | Yamazaki et al. | |
| 7,465,677 B2 | 12/2008 | Isobe et al. | |
| 2006/0238132 A1 | 10/2006 | Kitamura et al. | |
| 2006/0275710 A1* | 12/2006 | Yamazaki et al. | ........... 430/313 |
| 2008/0299689 A1 | 12/2008 | Yamazaki | |
| 2009/0011611 A1 | 1/2009 | Ichijo et al. | |

FOREIGN PATENT DOCUMENTS

| | | |
|---|---|---|
| EP | 1 811 562 | 7/2007 |
| JP | 11-121763 | 4/1999 |

(Continued)

*Primary Examiner*—Michelle Estrada
(74) *Attorney, Agent, or Firm*—Eric J. Robinson; Robinson Intellectual Property Law Office, P.C.

(57) ABSTRACT

A method for manufacturing an insulating film, which is used as an insulating film used for a semiconductor integrated circuit, whose reliability can be ensured even though it has small thickness, is provided. In particular, a method for manufacturing a high-quality insulating film over a substrate having an insulating surface, which can be enlarged, at low substrate temperature, is provided. A monosilane gas ($SiH_4$), nitrous oxide ($N_2O$), and a rare gas are introduced into a chamber to generate high-density plasma at a pressure higher than or equal to 10 Pa and lower than or equal to 30 Pa so that an insulating film is formed over a substrate having an insulating surface. After that, the supply of a monosilane gas is stopped, and nitrous oxide ($N_2O$) and a rare gas are introduced without exposure to the air to perform plasma treatment on a surface of the insulating film.

23 Claims, 16 Drawing Sheets

FOREIGN PATENT DOCUMENTS

| | | |
|---|---|---|
| JP | 2001-291872 | 10/2001 |
| JP | 2006-332634 | 12/2006 |
| JP | 2007-005705 | 1/2007 |
| JP | 2007-048982 | 2/2007 |
| WO | WO 2004/017396 | 2/2004 |

* cited by examiner

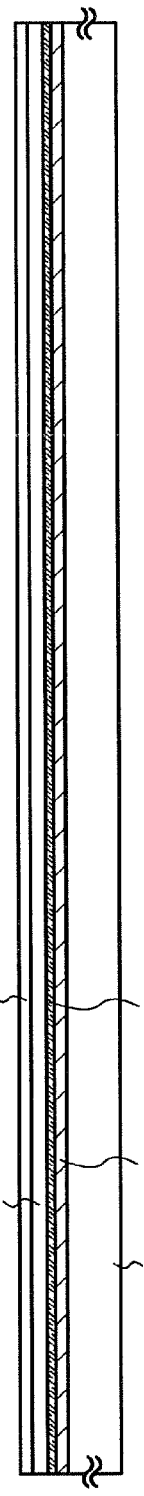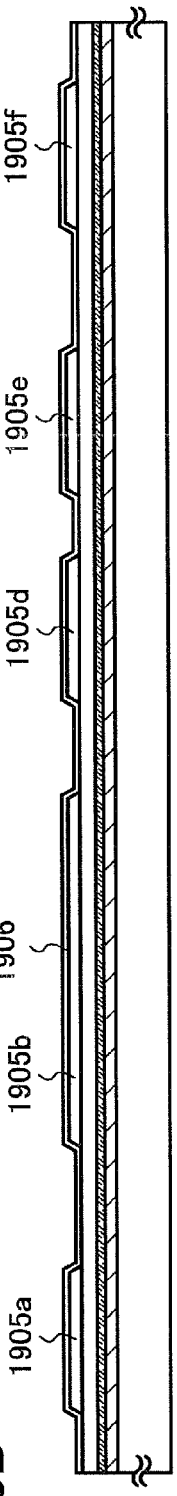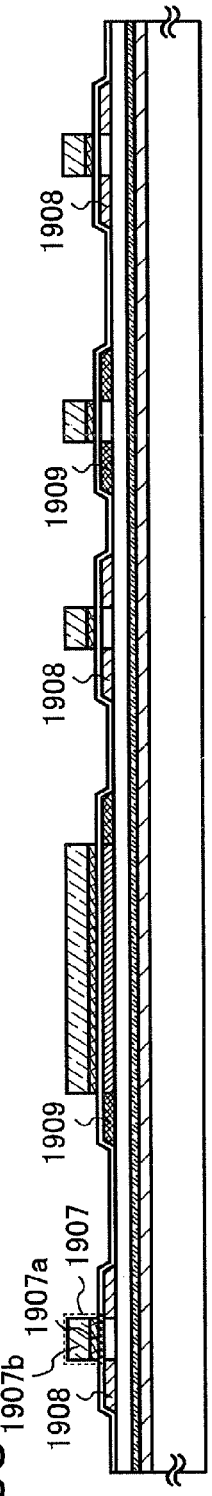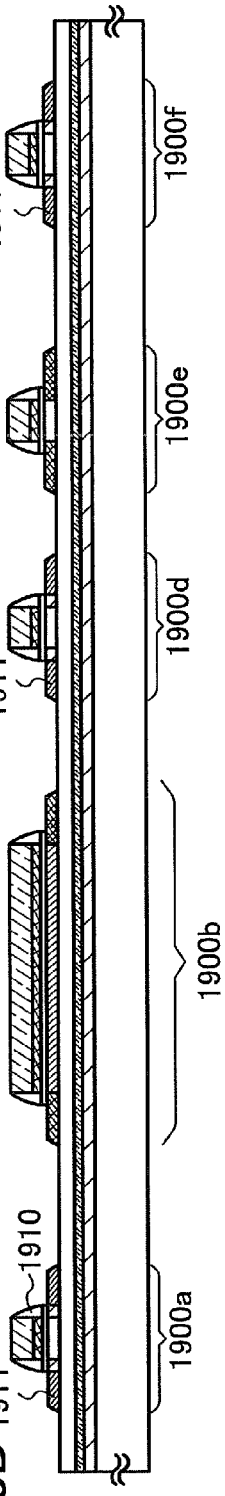

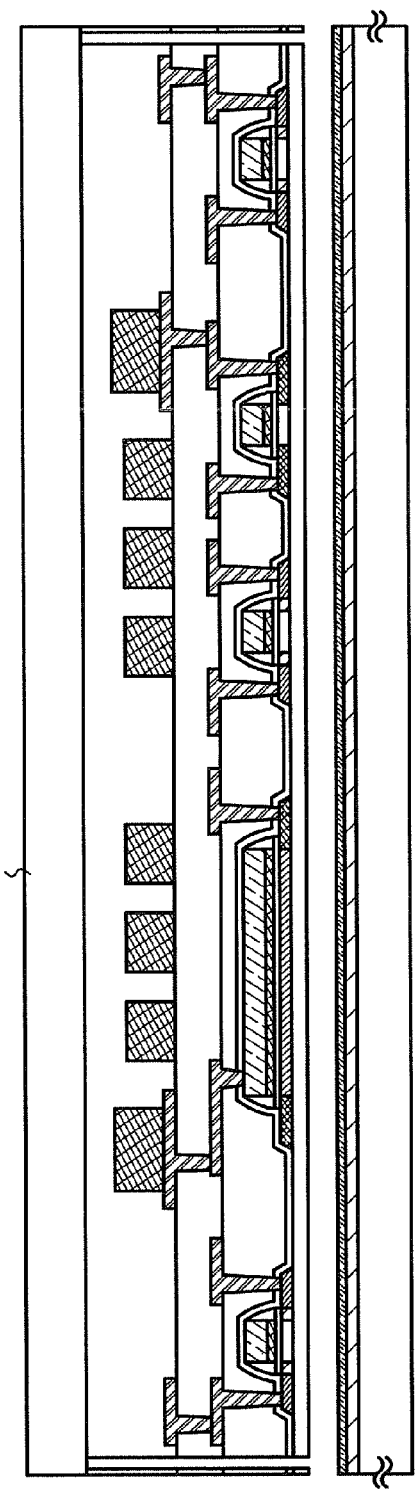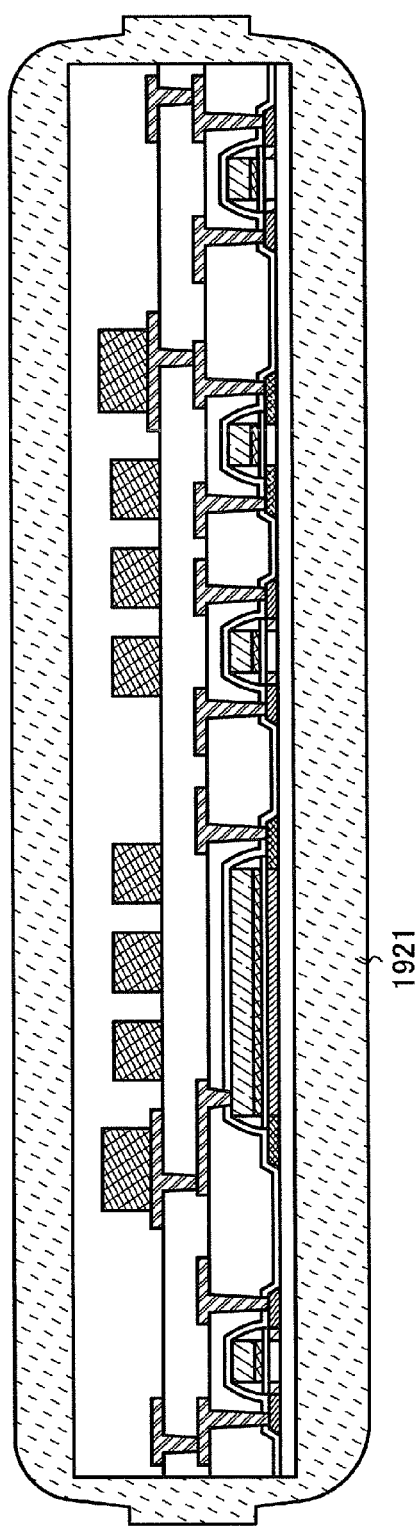
FIG. 10A
FIG. 10B

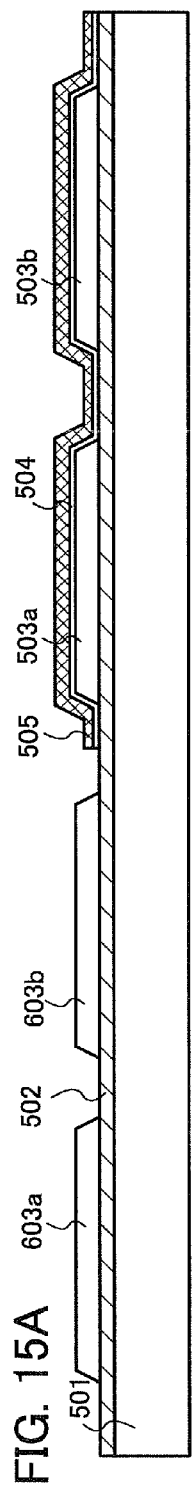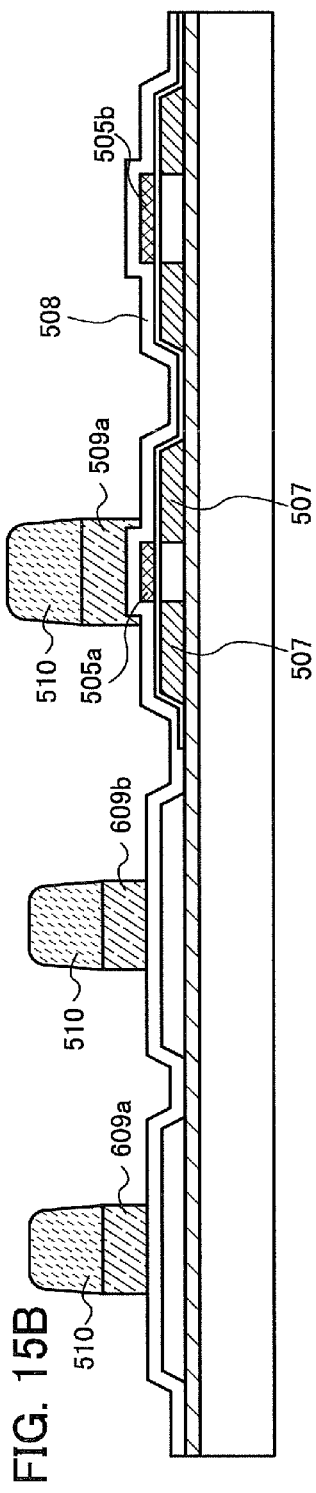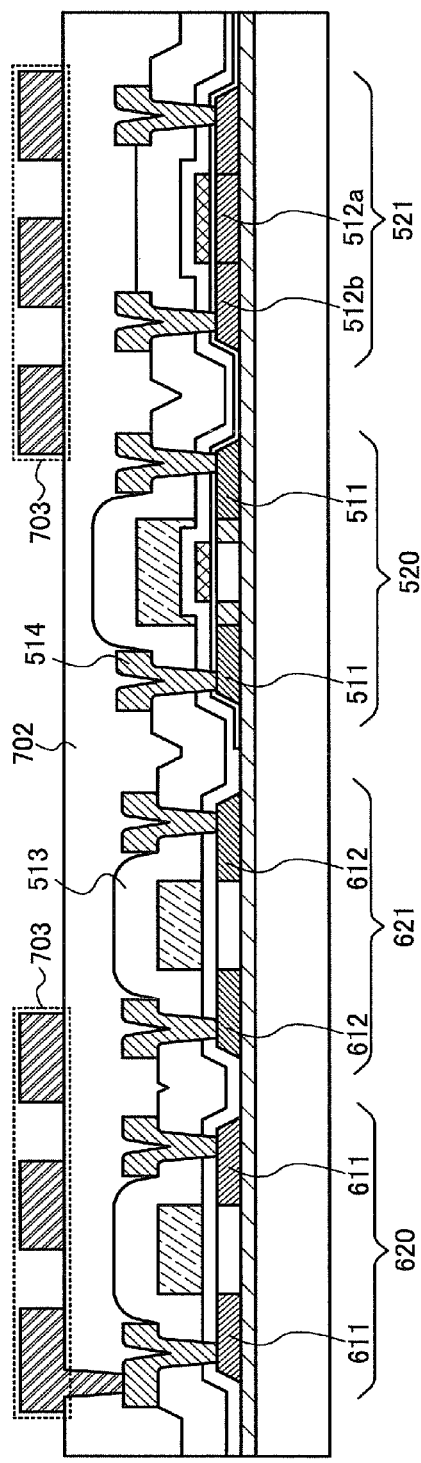

METHOD FOR MANUFACTURING SEMICONDUCTOR DEVICE

BACKGROUND OF THE INVENTION

1. Field of the Invention

The present invention relates to a semiconductor device having a circuit formed using a thin film transistor (hereinafter referred to as TFT) and a manufacturing method thereof. For example, the present invention relates to an electro-optic device typified by a liquid crystal display panel, a light-emitting display device having an organic light-emitting element, a wireless chip on which an antenna is mounted, or an electronic device on which a light receiving element or the like is mounted as a component.

Note that in this specification, a semiconductor device refers to all devices that can function by utilizing semiconductor characteristics. An electro-optical device, a semiconductor circuit, and an electronic device are all semiconductor devices.

2. Description of the Related Art

In recent years, a technique for forming a thin film transistor (TFT) by using a semiconductor thin film (having a thickness of approximately several nanometers to several hundred nanometers) formed over a substrate having an insulating surface has attracted attention. In future, thin film transistors are expected to be widely applied to electronic devices such as ICs or electro-optical devices. Thin film transistors having minuter structures need to be developed in accordance with demands for miniaturization and higher performance of semiconductor devices.

In order to manufacture thin film transistors having minute structures, not only conductive films such as gate electrodes, source wirings, or drain wirings but also insulating films typified by gate insulating films are desired to be thinned.

In the case where an integrated circuit into which a thin film transistor is incorporated is mounted on an electronic device, for example, a drive voltage higher than or equal to 5 V and lower than or equal to 10 V is used in a pixel portion of a liquid crystal panel, depending on the mode of liquid crystals. Thus, the thin film transistor provided in the pixel portion preferably has a structure suitable for operation at a drive voltage higher than or equal to 5 V and lower than or equal to 10 V.

Further, as a method for reducing power consumption of liquid crystal display devices, a method for lowering drive voltage can be used. Gate insulating films of thin film transistors are thinned so that the drive capability of the thin film transistors is prevented from decreasing even though the thin film transistors are operated at low voltage.

As a method for forming a gate insulating film having small thickness, a method for forming an oxide film by thermal oxidation can be used. However, since thermal oxidation is high-temperature heat treatment, heat temperature at the time of thermal oxidation exceeds the melting point of a glass substrate in the case of using the glass substrate as a substrate. Further, the thermal oxidation oxidizes part of a semiconductor layer, which leads to decrease in thickness of the semiconductor layer. In the case where the semiconductor layer is extremely thin, there is a possibility that the semiconductor layer disappear.

When a gate insulating film of a thin film transistor is thinned, it is possible to lower voltage which is necessary for switching; however, there is a possibility that the withstand voltage of the thin film transistor be lowered.

Therefore, in order to ensure the reliability of the thin film transistor, the gate insulating film is required to have large thickness to some extent. In a conventional electronic device on which an integrated circuit is mounted, reliability is given top priority. Thus, a gate insulating film having certain large thickness is used.

Not only liquid crystal display devices but also light-emitting display devices having organic light-emitting elements, wireless chips on which antennas are mounted, and light receiving elements have similar problems in that the gate insulating film is required to have large thickness to some extent in order to ensure reliability.

Reference 1 (Japanese Published Patent Application No. 2006-332634) discloses a method for forming a dense insulating film by performing plasma treatment using high frequency on a semiconductor film or an insulating film formed over a substrate having an insulating surface, such as a glass substrate.

Further, Reference 2 (Japanese Published Patent Application No. H11-121763) discloses a capacitor with an insulating film used as a dielectric, which includes a capacitor line and a semiconductor thin film which is the same semiconductor thin film as a channel formation region of a thin film transistor connected to a pixel electrode in order to increase the integration level of a circuit in an active matrix display device.

SUMMARY OF THE INVENTION

Demands for the high withstand voltage of an insulating film used for a semiconductor element such as a transistor or a capacitor are significantly increased, and further improvement in film characteristics is required. For example, by thinning a gate insulating film of a transistor, there is a possibility that the withstand voltage be lowered and dielectric breakdown of the gate insulating film occur.

Further, also in a capacitor, by thinning an insulating film which serves as a dielectric, it is possible to ensure a large capacitance value with a small electrode area; however, a large amount of leakage current flows by application of voltage, so that there is a possibility that the capacitor itself be broken and does not operate.

As described above, as for an insulating film used for a semiconductor element such as a transistor or a capacitor, decrease in thickness and increase in reliability are expected.

Since an insulating film formed to small thickness by using a conventional parallel plate plasma treatment apparatus or a conventional sputtering apparatus has a defect inside the film and does not have sufficient film quality, there is a possibility that leakage current increase or short-circuit or the like occur.

It is an object to provide a method for manufacturing an insulating film, which is used as an insulating film used for a semiconductor integrated circuit, whose reliability can be ensured even though it has small thickness. In particular, it is an object to provide a high-quality insulating film over a substrate having an insulating surface, which can be enlarged, such as a glass substrate at low substrate temperature.

A semiconductor device which includes a capacitor having a thin insulating film serving as a dielectric and a thin film transistor over the same glass substrate is provided.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that an insulating film is formed over a substrate having an insulating surface, such as a glass substrate. After that, the supply of a monosilane gas is stopped, and nitrous oxide ($N_2O$) and a rare gas are introduced without exposure to the air to perform plasma treatment on a surface of the insulating film. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

The insulating film is formed using a high-density plasma apparatus. Here, a high-density plasma apparatus refers to an apparatus which can realize a plasma density higher than or equal to $1\times10^{11}/cm^3$. For example, plasma is generated by applying a microwave power higher than or equal to 3 kW and lower than or equal to 6 kW so that the insulating film is formed.

When the insulating film is formed, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have certain thickness, the insulating film has excellent step coverage. Further, as for the insulating film formed by using the high-density plasma apparatus, the thickness of a thin film can be controlled precisely.

Unlike the insulating film formed by using a conventional parallel plate plasma enhanced CVD apparatus in many points, the insulating film formed through the above process procedure has an etching rate which is lower than that of the insulating film formed by using the conventional parallel plate plasma enhanced CVD apparatus by 10% or more or 20% or more in the case where the etching rates with the same etchant are compared to each other. Thus, it can be said that the insulating film obtained by the above manufacturing method is a dense film.

Further, after a semiconductor film is formed over the substrate having an insulating surface, such as a glass substrate, and an insulating film is formed over the semiconductor film by the high-density plasma apparatus, nitrous oxide ($N_2O$) and a rare gas are introduced without exposure to the air to perform plasma treatment on a surface of the insulating film. After that, an impurity element which imparts one conductivity type is added to the semiconductor film through the insulating film. Then, a metal electrode is formed over the insulating film to form a capacitor.

As the impurity element which imparts one conductivity type, boron, which is an impurity element imparting p-type conductivity, is used. Since boron has a small atomic radius, boron can pass though the insulating film with little damage to the insulating film and can be added to the semiconductor film. Therefore, the thus obtained capacitor can have high withstand voltage even though the insulating film has small thickness.

Further, a semiconductor device formed by using the above method has features. The structure is as follows: a thin film transistor and a capacitor are formed over the same substrate; the capacitor uses an insulating film as a dielectric and includes a metal electrode and a semiconductor layer containing an impurity element which imparts one conductivity type to a semiconductor as a pair of electrodes; and the insulating film of the capacitor has the same or substantially the same thickness as a gate insulating film of the thin film transistor.

For example, by using the thus obtained insulating film as a gate insulating film of a thin film transistor which is a switching element of a liquid crystal display device, reliability can be ensured even if the thickness of the gate insulating film is 30 nm. In addition, even if the thus obtained insulating film as a dielectric is used as a storage capacitor of a liquid crystal display device by using one of the pair of electrodes as the semiconductor layer to which conductivity is added, reliability can be ensured. A storage capacitor in each pixel of the liquid crystal display device is about 2 to 5 pF, for example. Since a capacitance value can be increased by thinning the gate insulating film and improving quality, the electrode area of the storage capacitor can be reduced, so that the aperture ratio can be improved. Also in a light-emitting display device, a storage capacitor in each pixel is necessary and is about 0.2 to 0.5 pF, for example. Since a capacitance value can be increased by thinning the gate insulating film and improving quality in a manner similar to that of the liquid crystal display device, the electrode area of the storage capacitor can be reduced, so that the aperture ratio can be improved.

Further, by using the thus obtained insulating film as a gate insulating film of a thin film transistor used for an amplifier circuit of a photo IC having a photodiode, reliability can be ensured even if the thickness of the gate insulating film is 20 nm. By thinning the gate insulating film, variation in threshold voltage of the thin film transistor can be suppressed, which can contribute to reduction in power consumption of the photo IC.

Furthermore, when the thus obtained insulating film as a dielectric is used as a storage capacitor portion of a wireless chip having a thin film transistor by using one of the pair of electrodes as the semiconductor layer to which conductivity is added, reliability can be ensured even if the thickness of the insulating film is 10 nm. The wireless chip having a thin film transistor includes mainly a power supply circuit, a control circuit, a memory circuit, and a resonant capacitor portion. The power supply circuit rectifies AC signals received by an antenna and smoothes the signals to generate DC voltage. In addition, the power supply circuit includes a capacitor which is referred to as a storage capacitor portion for holding electric charge by rectifying AC signals and smoothing the signals. The capacitor uses an insulating film interposed between a pair of electrodes as a dielectric. Further, a different capacitor is also provided in the resonant capacitor portion or the like in the wireless chip. In the case where the capacitance of these capacitors is not sufficient, there is a possibility that communication distance be decreased or the wireless chip does not operate. If the area of the capacitors is increased, sufficient capacitance can be obtained. However, in the wireless chip, the area of the capacitors in an integrated circuit is increased, so that there is a possibility that power consumption is increased due to increase in size. Since power which can be obtained from the antenna is limited, increase in power consumption is a big problem for the wireless chip because there is a possibility that it will lead to decrease in communication distance. Further, not only the area but also the dielectric constant or the thickness of the insulating film influences the capacitance. Therefore, by forming the insulating film to a thickness of 10 nm, the capacitance can be increased. For example, in the case of transmitting and receiving wireless signals of a UHF band, the total capacitance value of the capacitor which is referred to as the storage capacitor portion for holding electric charge after an AC signal is rectified and smoothed exceeds 1 nF (1000 pF).

Moreover, by thinning a gate insulating film of the thin film transistor which is mounted on the wireless chip, variation in threshold voltage of the thin film transistor can be suppressed, so that operating voltage and power consumption of the wireless chip can be reduced. Accordingly, the communication distance of the wireless chip can be extended.

In mass production, manufacture of a wireless chip over a substrate having an insulating surface, such as a large-area glass substrate, has an advantage in manufacturing cost. On the other hand, in the case of forming a transmitting/receiving circuit over a substrate having an insulating surface, such as a glass substrate, when the circuit is formed using a thin film transistor, a wireless chip having a thin film transistor has a disadvantage that the area of circuits is increased as compared to a single crystal silicon chip in which circuits can be stacked three-dimensionally due to a minute design rule. Therefore, by thinning the insulating film, the area of an integrated circuit can be decreased and power consumption can be reduced, which is particularly effective in the wireless chip having a thin film transistor.

The above steps are not mere design issues but are issues invented by the inventors after the following careful examination. An insulating film is formed using a high-density plasma apparatus; a semiconductor device including a thin film transistor or a capacitor using the insulating film; and reliability tests of the semiconductor device are repeatedly performed.

Note that in this specification, a word which expresses a direction, such as "over", "below", "side", "horizontal", or "perpendicular", indicates a direction based on a surface of a substrate in the case where a device is provided over the surface of the substrate.

Note that terms expressing degrees, which are used in this specification, for example, "approximately" and "about" mean degrees of a reasonable amount of deviation from the modified terms such that the end results are not significantly changed. These terms should be construed as including a deviation of at least ±5% of the modified terms if this deviation would not negate the meaning of the words they modify.

An insulating film which is formed over a substrate having an insulating surface, such as a glass substrate, at low substrate temperature by using a high-density plasma apparatus is a silicon oxide film containing nitrogen. The insulating film can be a denser thin film than a film formed by using a parallel plate plasma enhanced CVD apparatus. Further, it is possible to realize a semiconductor device including a capacitor with a high-quality insulating film formed at low substrate temperature used as a dielectric and a thin film transistor with the high-quality insulating film used as a gate insulating film, over the same substrate having an insulating surface, such as a glass substrate.

BRIEF DESCRIPTION OF THE DRAWINGS

In the accompanying drawings:

FIGS. 8A to 8D are cross-sectional views illustrating manufacturing steps of a wireless chip;

FIGS. 10A and 10B are cross-sectional views illustrating manufacturing steps of the wireless chip;

FIGS. 15A to 15C are cross-sectional view illustrating manufacturing steps of a wireless chip.

DETAILED DESCRIPTION OF THE INVENTION

Embodiment Mode will be described below.

Figure 1:
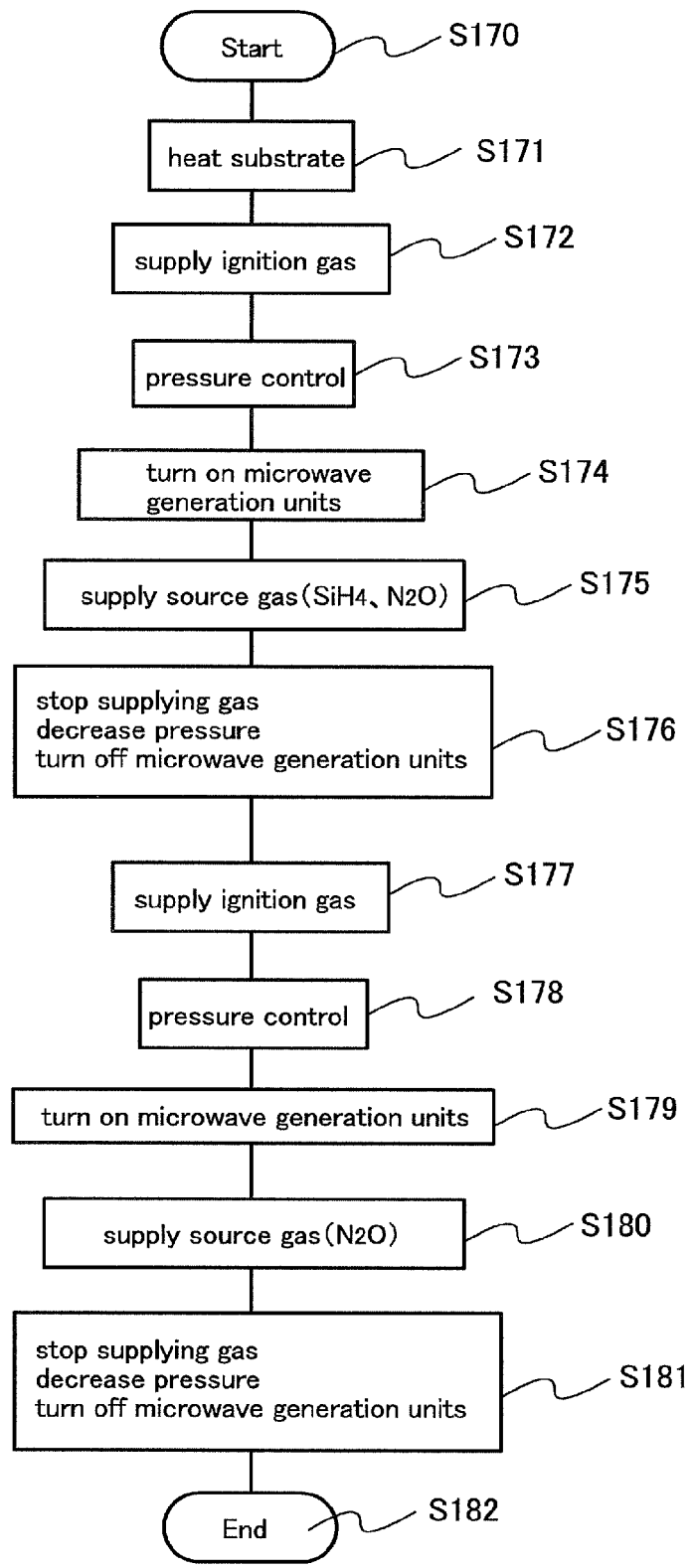
FIG. 1 is a chart illustrating a manufacturing flow.

FIG. 1 illustrates a manufacturing procedure flow for forming a thin insulating film which covers a semiconductor layer over a substrate having an insulating surface, such as a glass substrate.

A glass substrate over which a semiconductor layer is provided is transferred to a processing container of a high-density plasma apparatus (a microwave plasma enhanced CVD apparatus having a frequency higher than or equal to 1 GHz, here, having a frequency of 2.45 GHz)

Figure 2:
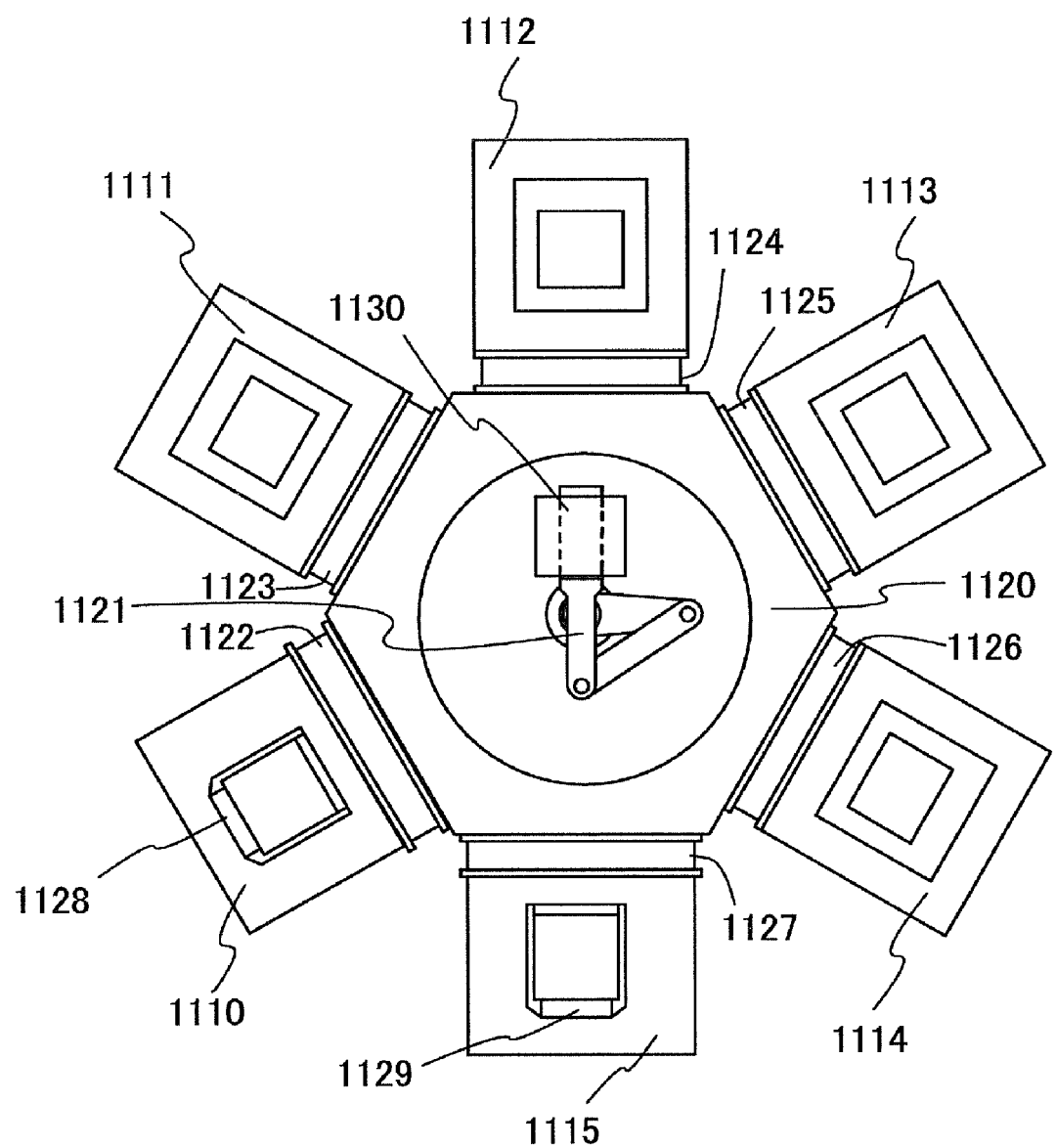
FIG. 2 is a top view of a high-density plasma apparatus.

Here, FIG. 2 illustrates a top view of an example of a high-density plasma enhanced CVD apparatus. A common chamber 1120 is connected to load/unload (L/UL) chambers 1110 and 1115 and first to fourth reaction chambers 1111 to 1114 through gate valves 1122 to 1127. Substrates 1130 are loaded into cassettes 1128 and 1129 of the load/unload (L/UL) chambers 1110 and 1115 and are transferred to the respective reaction chambers by a transfer unit 1121 of the common chamber 1120.

Note that although the high-density plasma enhanced CVD apparatus illustrated in FIG. 2 includes a plurality of load/unload (L/UL) chambers, it may include only one load/unload (L/UL) chamber. In addition, the high-density plasma enhanced CVD apparatus may include a spare chamber. By pre-heating the substrate in the spare chamber, it is possible to shorten heating time needed before film formation in each reaction chamber, so that throughput can be improved.

Figure 3:
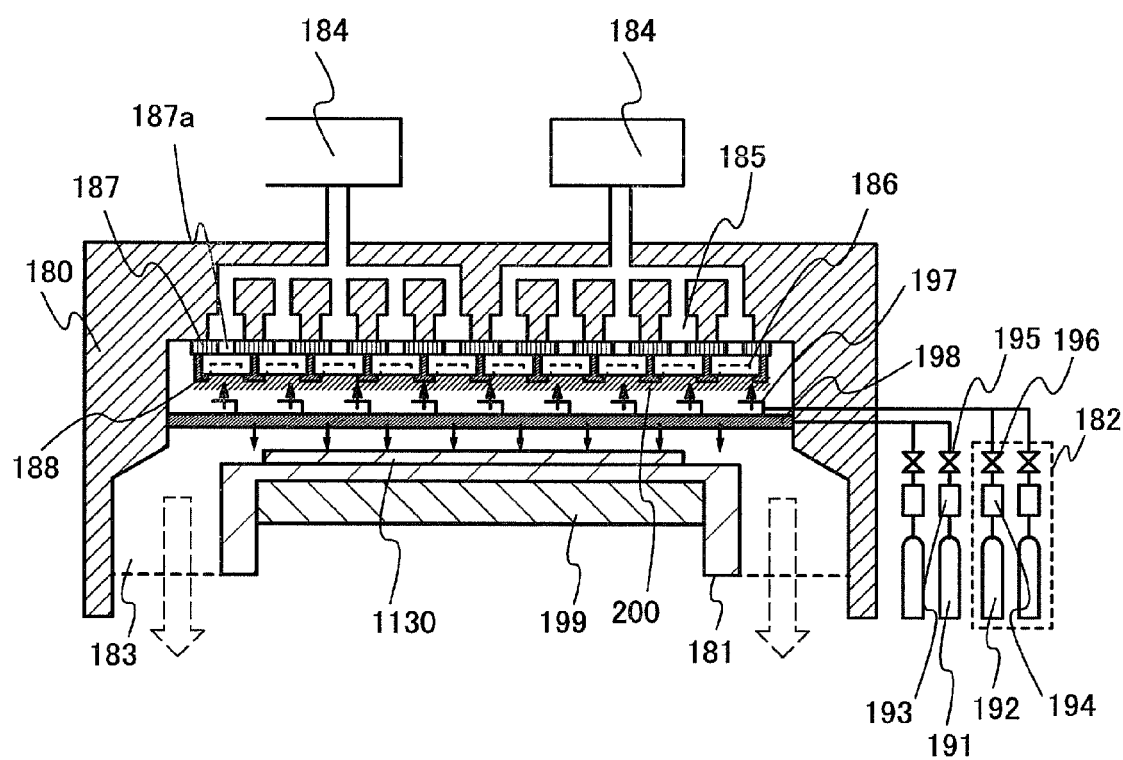
FIG. 3 is a cross-sectional view of the high-density plasma apparatus.

FIG. 3 illustrates an example of the structure of one reaction chamber of such a high-density plasma enhanced CVD apparatus in detail. FIG. 3 is a cross-sectional view. One reaction chamber includes a processing container 180, a support 181 which is provided in the processing container 180 and is used for providing the substrate 1130, a gas supply portion 182 for introducing gas into the processing container 180, an exhaust port 183 which is connected to a vacuum pump for exhausting gas in the processing container 180, microwave generation devices 184 for supplying microwaves to generate plasma, waveguides 185 for introducing the microwaves from a microwave supply portion into the processing container 180, a top plate 187 which is in contact with the waveguides 185 and has openings 187*a*, and a plurality of dielectric plates 186 fixed to the top plate 187 with fixing tools 188.

Gas pipes 197 for supplying an ignition gas and a gas pipe 198 for supplying a source gas are provided between the substrate 1130 and the dielectric plates 186. The gas pipes 197 and 198 are connected to the gas supply portion 182. Specifically, the gas pipes 197 for supplying an ignition gas are connected to an ignition gas supply source 192 through a valve 196 and a mass flow controller 194. In addition, the gas pipe 198 for supplying a source gas is connected to a source gas supply source 191 through a valve 195 and a mass flow controller 193. Further, by providing a temperature control portion 199 for the support 181, the temperature of the substrate 1130 can also be controlled. Furthermore, a high-frequency power source may be connected to the support 181, and predetermined bias voltage may be applied to the support 181 by AC power output from the high-frequency power source. Note that the gas supply portion 182 and the microwave generation devices 184 are provided outside the processing container.

The microwave generation devices 184 supply microwaves having a frequency greater than or equal to 1 GHz, preferably 2.45 GHz or 8.3 GHz. Note that by providing the plurality of microwave generation devices 184, wide plasma can be generated stably. Therefore, a highly uniform film can also be formed over a large-area substrate which is longer than 600 mm on one side, particularly a large-area substrate which is longer than 1000 mm on one side, and a deposition rate can be increased.

The dielectric plates 186 are provided so as to be in close contact with the openings of the top plate 187. Microwaves generated in the microwave generation devices 184 are propagated to the dielectric plates 186 by passing through the waveguide 185 and the openings of the top plate 187 and are transmitted through the dielectric plates 186 to be released into the processing container. By field effect energy of the microwaves released into the processing container, the ignition gas is made into a plasma state. Since this plasma 200 has higher density on surfaces of the dielectric plates 186, damage to the substrate 1130 can be reduced. Further, by providing the plurality of dielectric plates 186, uniform wide plasma can be generated and kept. Note that the dielectric plates 186 may have hollows on the side where the plasma 200 is generated. Due to the hollows, stable plasma can be generated.

The gas pipe 197 for supplying an ignition gas and the gas pipe 198 for supplying a source gas are provided to intersect with each other. A nozzle of the gas pipe 197 for supplying an ignition gas is provided on the dielectric plates 186 side. A nozzle of the gas pipe 198 for supplying a source gas is provided on the substrate 1130 side. By releasing the ignition gas on the dielectric plates 186 side, the plasma 200 can be generated while preventing film formation on the surfaces of the dielectric plates 186. Further, the source gas can be released at a position which is closer to the substrate 1130, so that the deposition rate can be increased. The gas pipes 197 and 198 are formed using ceramics such as alumina or aluminum nitride. Since the transmittance of microwaves is high in ceramics, by forming the gas pipes 197 and 198 using ceramics, the distribution of plasma can be made uniform without disturbing an electric field, even if the gas pipe is provided right under the dielectric plates 186.

The procedure of film formation treatment using the high-density plasma apparatus illustrated in FIG. 2 and FIG. 3 is described below. First, film formation treatment starts in Step S170 in FIG. 1. In Step S171, a substrate is heated. The substrate is heated at room temperature or at a temperature higher than or equal to 100° C. and lower than or equal to 550° C. by the temperature control portion.

In Step S172, the inside of the processing container is made into a vacuum state, and an oxygen gas and one or more rare gases such as helium, argon, xenon, and krypton are introduced into the processing container as a plasma ignition gas. In the case of using a frequency of 2.45 GHz, by introducing an oxygen gas as well as a rare gas into the processing container, plasma ignition can be facilitated. Note that by setting conditions of plasma generation, such as frequency, as appropriate, the plasma ignition can be performed by introducing a rare gas and nitrous oxide into the processing container, without using an oxygen gas. In this case, the kinds of gases used can be reduced.

Next, in Step S173, the pressure in the processing container is set at predetermined pressure, higher than or equal to 1 Pa and lower than or equal to 200 Pa, preferably higher than or equal to 10 Pa and lower than or equal to 20 Pa. Next, in Step S174, the microwave generation units are turned on, and microwaves are supplied from the microwave generation units to the waveguides to generate plasma in the processing container. The output of the microwave generation unit is greater than or equal to 500W and less than or equal to 6000 W, preferably greater than or equal to 4000 W and less than or equal to 6000 W. When plasma is excited by introducing microwaves, plasma with a low electron temperature (higher than or equal to 0.7 eV and lower than or equal to 3 eV, preferably higher than or equal to 0.7 eV and lower than or equal to 1.5 eV) and a high electron density (higher than or equal to $1\times10^{11}$ cm$^{-3}$ and lower than or equal to $1\times10^{13}$ cm$^{-3}$) can be generated.

Next, in Step S175, the source gas is introduced into the reaction chamber through the gas pipe. Specifically, after the supply of an oxygen gas is stopped and nitrous oxide and a rare gas are introduced as the source gas, nitrous oxide, a rare gas, and a silicon compound gas are introduced; thus, a silicon oxide film which covers the semiconductor layer can be formed over the substrate. In specific, as for the source gas, the flow ratio of nitrous oxide to silane is greater than or equal to 10:1 and less than or equal to 300:1, preferably 50:1.

Next, in Step S176, the supply of the source gas is stopped; the pressure in the processing container is decreased; and the microwave generation units are turned off.

Next, in Step S177, an oxygen gas and one or more rare gases such as helium, argon, xenon, and krypton are introduced into the processing container as the plasma ignition gas.

Next, in Step S178, the pressure in the processing container is set at predetermined pressure.

Next, in Step S179, the microwave generation units are turned on, and microwaves are supplied from the microwave generation units to the waveguides to generate plasma in the processing container.

Next, in Step S180, the source gas is introduced into the processing container 180 through the gas pipe. Specifically, by stopping the supply of an oxygen gas and introducing nitrous oxide and a rare gas as the source gas, plasma treatment is performed on a surface of the silicon oxide film.

Next, in Step S181, the supply of the source gas is stopped; the pressure in the processing container is decreased; the microwave generation units are turned off; and the deposition process is finished in Step S182. Then, the substrate is transferred outside the processing container.

In the case where the thus obtained silicon oxide film containing nitrogen is used for a gate insulating film of a thin film transistor or a dielectric of a capacitor, the withstand voltage of a semiconductor element can be increased.

In order to measure the withstand voltage of the obtained insulating film, the following tests were performed.

Manufacturing procedure of a sample is illustrated. First, an amorphous silicon film is formed over a glass substrate by using a parallel plate plasma enhanced CVD apparatus, and the amorphous silicon film is scanned (with a scan rate of 350 mm/s) with laser light having a wavelength of 532 nm (having a beam width of 500 μm in a long axis direction) to be crystallized, so that a polysilicon film is formed. Note that before the laser irradiation, an oxide film is removed by wet etching using etchant containing hydrofluoric acid.

Subsequently, after the polysilicon film is selectively etched to form an island-shaped semiconductor layer, an insulating film is formed so as to cover the island-shaped semiconductor layer by using a high-density plasma apparatus.

Note that before the insulating film is formed, plasma treatment is performed using the high-density plasma apparatus. A high-density plasma apparatus having four microwave generation devices (4.5 kW) is used. The plasma treatment is performed for 5 minutes under the following conditions: a pressure of 20 Pa; a substrate temperature of 325° C.; a gap interval (an interval between a dielectric and the substrate) of 160 mm; a nitrous oxide flow rate of 1000 sccm; an argon flow rate of 2500 sccm. Subsequently, an insulating film having a thickness of 10 nm is formed under the following conditions: a pressure is 20 Pa; a substrate temperature of 325° C.; a gap interval (an interval between the dielectric and the substrate) of 160 mm; a monosilane flow rate of 30 sccm; a nitrous oxide flow rate of 1500 sccm; an argon flow rate of 2500 sccm. After the insulating film is formed, plasma treatment under the same conditions as the plasma treatment performed before the insulating film is formed is performed again.

Subsequently, the semiconductor layer which overlaps with the insulating film is doped with boron through the insulating film. The doping treatment is performed at an accelerating voltage of 20 kV at a concentration higher than or equal to $1\times10^{19}/cm^3$ and lower than $1\times10^{20}/cm^3$.

Subsequently, an electrode is formed over the insulating film which overlaps with the semiconductor layer, and boron is added to the semiconductor layer by using the electrode as a mask. Note that the doping treatment is performed such that boron is added at a concentration higher than or equal to $1\times10^{20}/cm^3$ and lower than $1\times10^{22}/cm^3$.

Figure 4A:
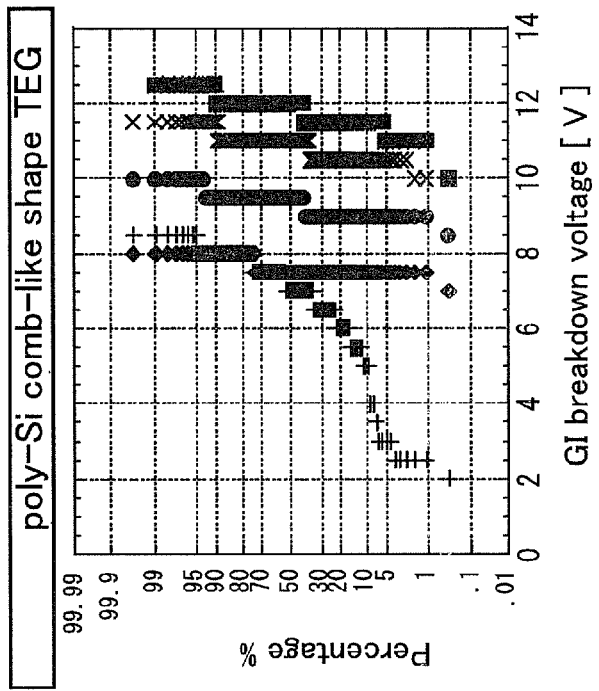
FIGS. 4A and 4B are graphs illustrating results of reliability tests.

In addition, a sample formed through process procedure which is different from the above sample in which boron is added to the semiconductor layer through the insulating film, specifically, a sample on which doping is performed before an insulating film is formed is manufactured, and voltage is continuously applied to the sample until dielectric breakdown occurs. FIG. 4A is a graph illustrating the distribution thereof.

In addition, FIG. 4A also illustrates the results of the accelerating voltage of doping. Further, FIG. 4A also illustrates the results of a sample doped with phosphorus instead of boron. From the results in FIG. 4A, it can be seen that the sample in which doping is performed on the semiconductor layer through the insulating film has higher withstand voltage than the sample on which doping is performed before the insulating film is formed. Moreover, from the results in FIG. 4A, it can be seen that the sample with lower accelerating voltage of doping has higher withstand voltage.

Furthermore, from FIG. 4A, it can be seen that the sample in which the semiconductor layer which overlaps with the electrode is doped with boron has higher withstand voltage than the sample in which the semiconductor layer which overlaps with the electrode is doped with phosphorus. This is because the insulating film is damaged by doping in the case where an ion species is phosphorus; however, boron can reduce damage because of its smaller atom size than that of phosphorus.

Figure 4B:
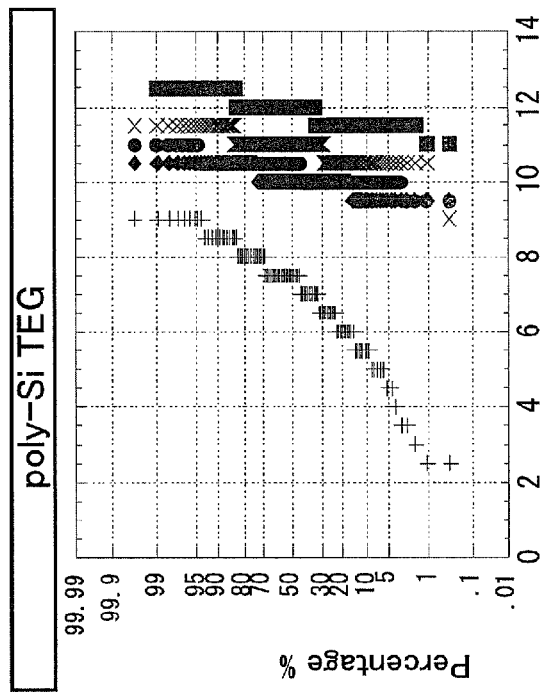

Further, FIG. 4B illustrates the results of a sample having a different top surface shape of a semiconductor layer from FIG. 4A, specifically, a sample in which a semiconductor layer which overlaps with an electrode is formed into a rectangular shape. It is notable in FIG. 4B that the sample doped with boron through an insulating film shows the same or substantially the same results as FIG. 4A. Form this point, although unevenness is also generated in the insulating film formed over the semiconductor layer in the case where the semiconductor layer has a rectangular shape, it can be said that through the manufacturing method illustrated in this embodiment mode, a uniform insulating film even with a small thickness of 10 nm is formed over the rectangular semiconductor layer with favorable coverage.

Note that although an example in which plasma treatment is performed before and after the insulating film is formed is illustrated in FIGS. 4A and 4B, the timing of performing plasma treatment is not particularly limited to the example. For example, in order to obtain higher reliability, plasma treatment is preferably performed only after the insulating film is formed.

Figure 5A:
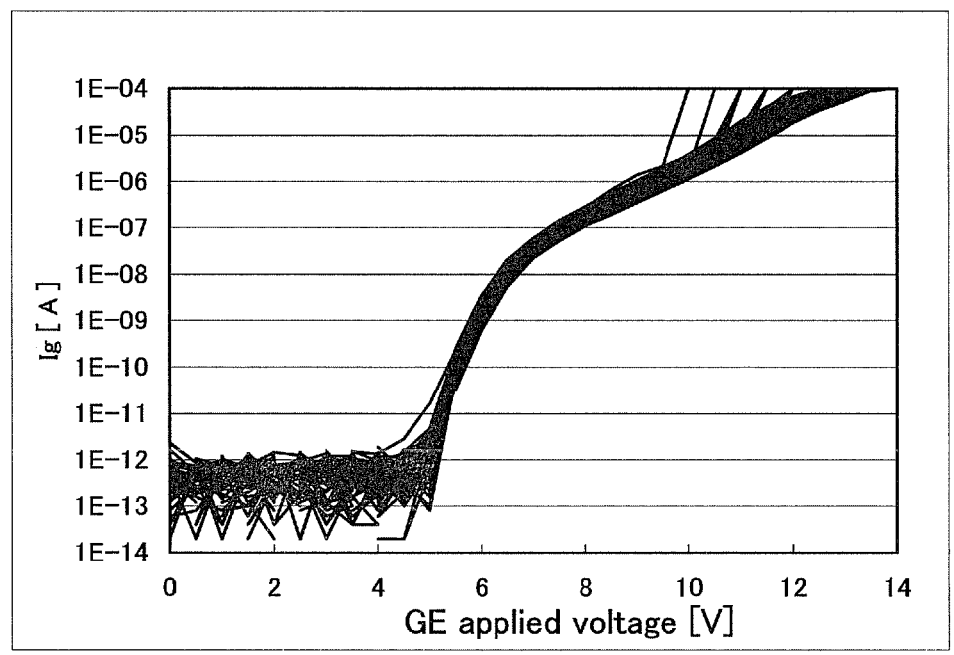
FIGS. 5A and 5B are graphs illustrating I-V characteristics.
Figure 5B:
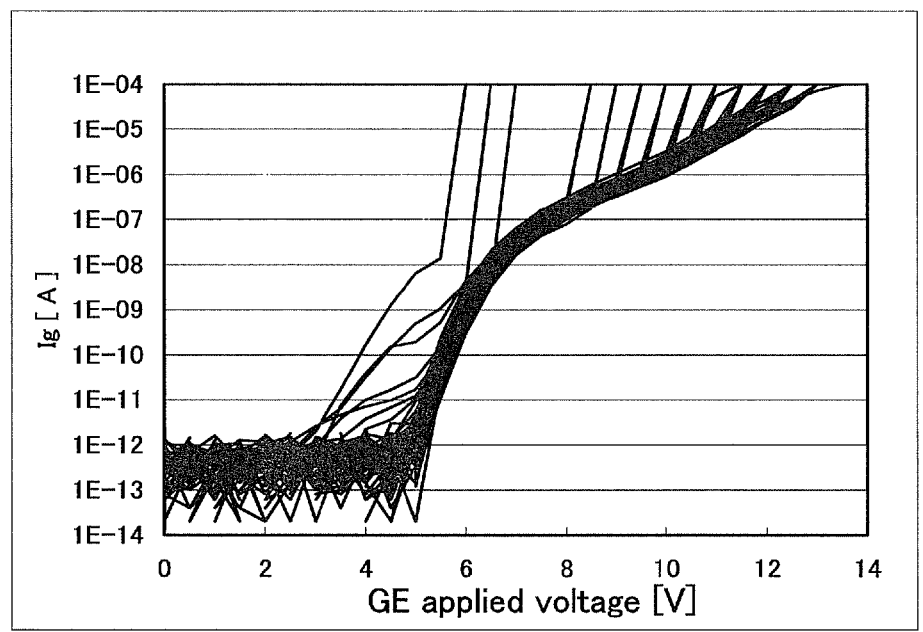

In addition, as the accelerating voltage of doping treatment becomes lower, variation in I-V characteristics is further reduced. FIGS. 5A and 5B are graphs illustrating I-V characteristics. FIG. 5A illustrates the measurement results illustrating variation in I-V characteristics of a sample in which a rectangular semiconductor layer which overlaps with an electrode is doped with phosphorus at 10 kV. FIG. 5B illustrates the measurement results illustrating variation in I-V characteristics of a sample in which a rectangular semiconductor layer which overlaps with an electrode is doped with phosphorus at 20 kV.

Figure 6:
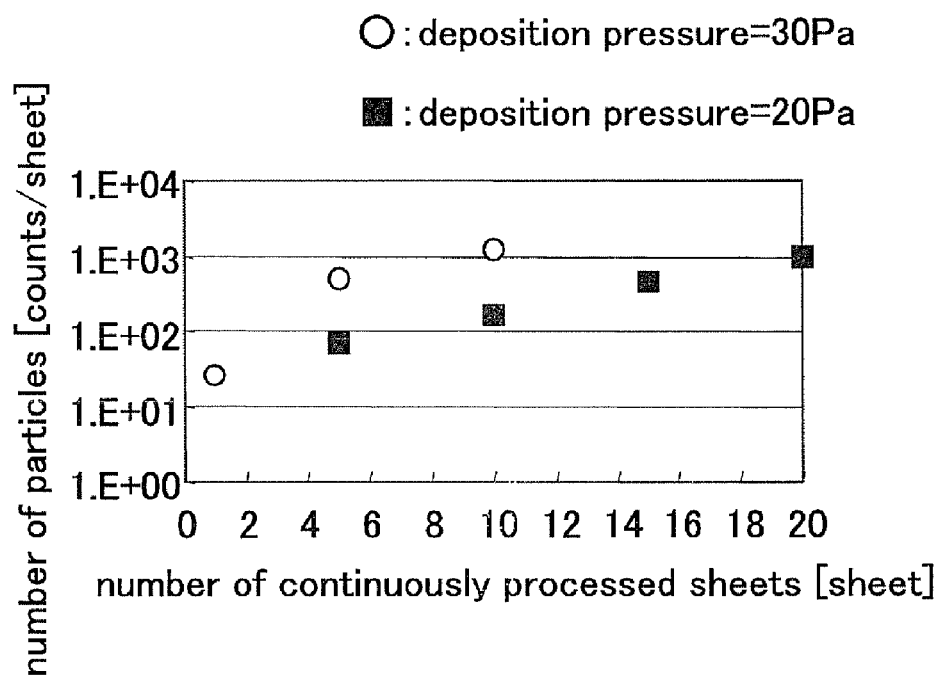
FIG. 6 is a graph illustrating pressure dependency.

Further, FIG. 6 illustrates the measurement results of the pressure dependency of the number of particles after the insulating film is formed. An insulating film having a thickness of 10 nm is formed under the following conditions: a substrate temperature of 325° C.; a gap interval of 160 mm; a silane flow rate of 30 sccm; a nitrous oxide flow rate of 3000 sccm; an argon flow rate of 2500 sccm. The number of particles at a deposition pressure of 20 Pa and the number of particles at a deposition pressure of 30 Pa are compared to each other. As illustrated in FIG. 6, it can been seen that the number of particles at the deposition pressure of 20 Pa is smaller than the number of particles at the deposition pressure of 30 Pa and the deposition pressure of 20 Pa is a preferable pressure condition. Under the deposition conditions of FIG. 6, the flow ratio of nitrous oxide to silane is 100:1, which is a condition where more particles are generated than the case where the flow ratio of nitrous oxide to silane is 50:1. If many particles are generated, there is a possibility that a minute projecting portion is formed over a surface of the insulating film, which leads to decrease in thickness uniformity.

Here, an example of comparison using the insulating film having a thickness of 10 nm is described; however, the thickness of the insulating film is not particularly limited to this thickness. An advantageous effect which is similar to that of the example can be obtained as long as the insulating film has a small thickness less than 100 nm. Needless to say, as the thickness becomes smaller, time for film formation can be further shortened. In addition, in the case of forming a capacitor with an insulating film formed using a high-density plasma apparatus used as a dielectric, a larger capacitor can be formed as the thickness becomes smaller.

Figure 7:
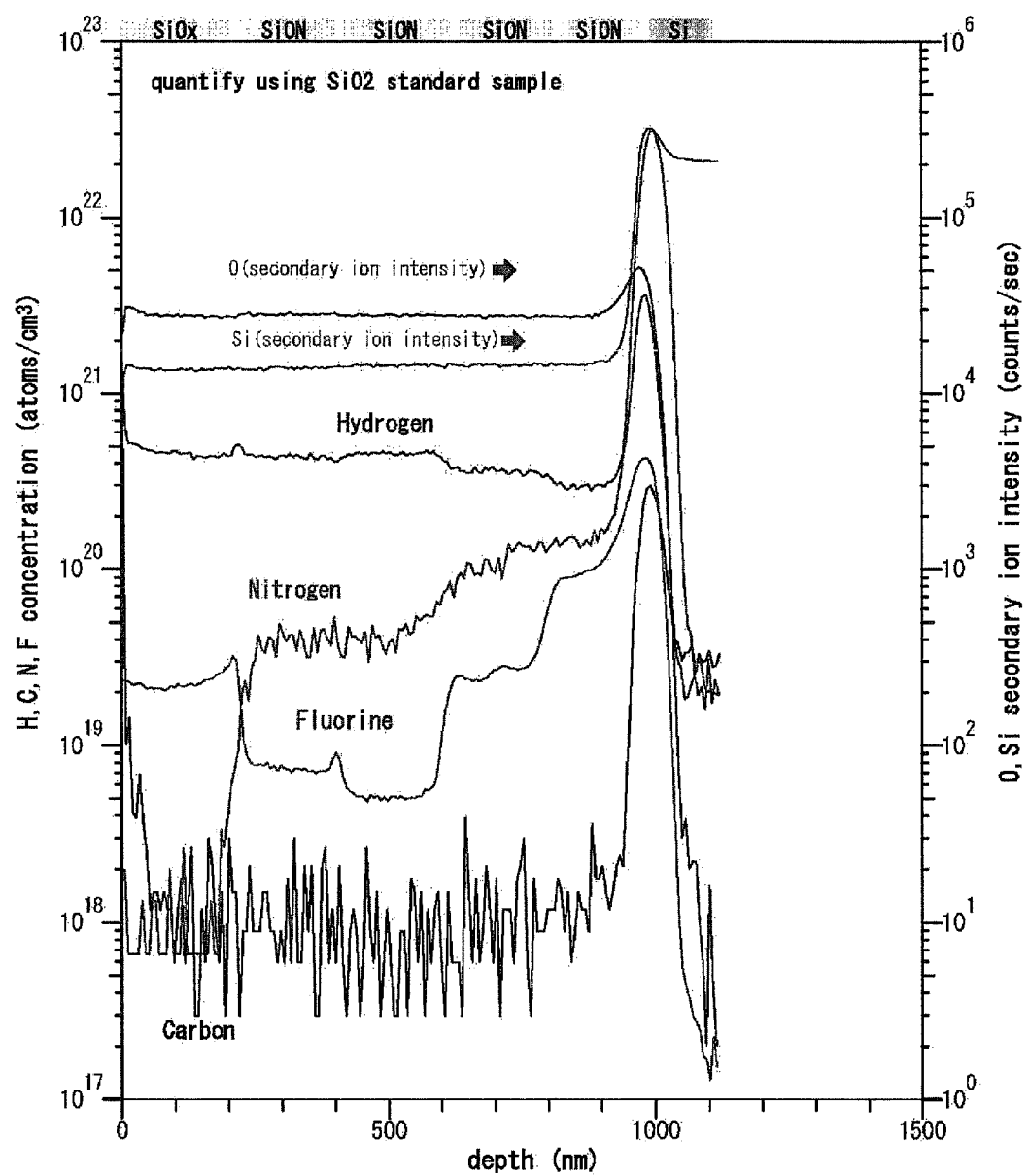
FIG. 7 is a graph illustrating analyses of SIMS.

Further, FIG. 7 illustrates the measurement results of concentrations of hydrogen, carbon, nitrogen, and fluorine contained in a film by analysis using SIMS (secondary ion mass spectrometry). The film is obtained by stacking a first insulating film, a second insulating film, a third insulating film, a fourth insulating film, and a fifth insulating film each having a thickness of 200 nm over a silicon wafer by using a high-density plasma apparatus. The first insulating film is formed under the following conditions: a pressure of 20 Pa; a silane flow rate of 30 sccm; a nitrous oxide flow rate of 1500 sccm; a nitrous oxide/silane flow ratio of 50:1. The second insulating film is formed under the following conditions: a pressure of 20 Pa; a silane flow rate of 60 sccm; a nitrous oxide flow rate of 3000 sccm; a nitrous oxide/silane flow ratio of 50:1. The third insulating film is formed under the following conditions: a pressure of 30 Pa; a silane flow rate of 100 sccm; a nitrous oxide flow rate of 3000 sccm; a nitrous oxide/silane flow ratio of 30:1. The fourth insulating film is formed under the following conditions: a pressure of 30 Pa; a silane flow rate of 250 sccm; a nitrous oxide flow rate of 2500 sccm; a nitrous oxide/silane flow ratio of 10:1. Note that as for the first to fourth insulating films, an argon gas with a flow rate of 2500 sccm is ejected on the dielectric plate side and a source gas (silane and nitrous oxide) is ejected on the substrate side. Further, the fifth insulating film is a reference of a silicon oxide film. The fifth insulating film is formed under the following conditions: a pressure of 15 Pa; a silane flow rate of 250 sccm; an oxygen flow rate of 1500 sccm; an argon flow rate of 3500 sccm; all the gases are ejected on the substrate side. As for the first to fifth insulating films, substrate temperature is 325° C. and a gap interval is 160 mm. From FIG. 7, it can be seen that the concentration of nitrogen in the insulating film obtained using silane and nitrous oxide as a deposition gas by using the high-density plasma apparatus is higher than or equal to $1\times10^{19}/cm^3$ and lower than $1\times10^{21}/cm^3$. In this embodiment mode, by continuously performing plasma treatment using nitrous oxide on any one of the first to fourth insulating films in the same chamber as a deposition chamber without exposure to the air, the surface of the insulating film is further improved. Further, concentration in this specification refers to a concentration peak obtained by analysis using SIMS. SIMS analyzes concentrations from the low concentration side to the high concentration side in a depth direction.

Embodiment Mode having the above structure will be described in more detail in embodiments below.

Embodiment 1

In this embodiment, a structure in which a semiconductor device including an antenna circuit is formed over a substrate is described.

First, as illustrated in FIG. 8A, a separation layer 1903 is formed over one surface of a substrate 1901 with an insulating film 1902 interposed therebetween. Sequentially, an insulating film 1904 which functions as a base film and a semiconductor film 1905 (e.g., a film containing amorphous silicon) are stacked. Note that the insulating film 1902, the separation layer 1903, the insulating film 1904, and the semiconductor film 1905 can be sequentially formed.

Note that the substrate 1901 is selected from a glass substrate, a quartz substrate, a metal substrate (e.g., a stainless steel substrate), a ceramic substrate, or the like. Note that in this step, the separation layer 1903 is provided over the entire surface of the substrate 1901 with the insulating film 1902 interposed therebetween; however, when needed, the separation layer 1903 may be selectively provided by photolithography after the separation layer is formed over the entire surface of the substrate 1901.

In addition, the insulating film 1902 and the insulating film 1904 are formed using a material such as silicon oxide, silicon nitride, silicon oxynitride ($SiO_xN_y$) (x>y>0), or silicon nitride oxide ($SiN_xO_y$) (x>y>0) by plasma enhanced CVD, sputtering, or the like. For example, in the case where each of the insulating films 1902 and 1904 is formed having a two-layer structure, a silicon nitride oxide film may be formed as a first insulating film, and a silicon oxynitride film may be formed as a second insulating film. Alternatively, a silicon nitride film may be formed as the first insulating film, and a silicon oxide film may be formed as the second insulating film. The insulating film 1902 functions as a blocking layer which prevents an impurity element from being mixed into the separation layer 1903 or an element formed thereover from the substrate 1901. The insulating film 1904 functions as a blocking layer which prevents an impurity element from being mixed into an element formed over the separation layer 1903 from the substrate 1901 and the separation layer 1903. By forming the insulating films 1902 and 1904 which function as the blocking layers as described above, the element formed over the separation layer 1903 can be prevented from being adversely affected by alkaline metal such as Na or alkaline earth metal from the substrate 1901 and an impurity element included in the separation layer 1903. Note that in the case where quartz is used for the substrate 1901, the insulating films 1902 and 1904 may be omitted.

Further, a metal film, a layered structure of a metal film and a metal oxide film, or the like can be used for the separation layer 1903. A metal film is formed having a single-layer structure or a layered structure of a film formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or an alloy material or a compound material which contains any of the above elements as its main component. In addition, these materials can be formed by sputtering, plasma enhanced CVD, or the like. As a layered structure of a metal film and a metal oxide film, plasma treatment in an oxygen atmosphere or a nitrogen oxide atmosphere is performed or heat treatment in an oxygen atmosphere or a nitrogen oxide atmosphere is performed after the above metal film is formed, so that oxide or oxynitride of the metal film can be provided over a surface of the metal film. For example, in the case of providing a tungsten film as the metal film by sputtering, CVD, or the like, plasma treatment is performed on the tungsten film, so that a metal oxide film which is formed using tungsten oxide can be provided over a surface of the tungsten film. Alternatively, for example, after forming a metal film (e.g., tungsten), metal oxide may be formed over the metal film (e.g., tungsten oxide may be formed over tungsten) and an insulating film using silicon oxide or the like is formed over the metal film by sputtering. Further, for example, high-density plasma treatment using a high-density plasma apparatus may be performed as plasma treatment. Alternatively, instead of the metal oxide film, metal nitride or metal oxynitride may be used. In this case, plasma treatment or heat treatment may be performed on the metal film in a nitrogen atmosphere or an atmosphere containing nitrogen and oxygen.

Furthermore, the semiconductor film 1905 is formed to a thickness greater than or equal to 25 nm and less than or equal to 200 nm (preferably greater than or equal to 30 nm and less than or equal to 150 nm) by sputtering, LPCVD, plasma enhanced CVD, or the like.

Next, as illustrated in FIG. 8B, the semiconductor film 1905 is irradiated with a laser beam to be crystallized. Note that the semiconductor film 1905 may be crystallized by a method in which irradiation with a laser beam is combined with thermal crystallization using RTA or an annealing furnace or thermal crystallization using a metal element which promotes crystallization, or the like.

An example of a crystallization step is briefly described below. First, an amorphous semiconductor film is formed to a thickness of 66 nm by using a parallel plate plasma enhanced CVD apparatus. After that, by irradiating the amorphous semiconductor film with a megahertz laser beam, the crystalline semiconductor film 1905 is formed. Note that in this specification, a megahertz laser beam refers to a laser beam having a repetition rate greater than or equal to 10 MHz and an ultra short pulse with a pulse width greater than or equal to 100 fs and less than or equal to 1 ns. When the repetition rate is greater than or equal to 10 MHz, heat can be continuously applied to a semiconductor film, so that continuous crystal growth is possible. In this embodiment, after an oxide film is removed before irradiation with a megahertz laser beam, the irradiation is performed under the following conditions: a $YVO_4$ laser having a repetition rate of 80 MHz and a pulse width of 15 ps; a wavelength of 532 nm; an irradiation power higher than or equal to 8 W and lower than or equal to 9 W; a beam width of 500 μm in a long axis direction; a scan rate of 350 mm/s. The thickness of the semiconductor film after the irradiation is 60 nm.

After the semiconductor film 1905 is crystallized, the obtained crystallized semiconductor film is etched using photolithography into a desired shape so that crystalline semiconductor films 1905a, 1905b, 1905d, 1905e, and 1905f are formed and a gate insulating film 1906 is formed so as to cover the semiconductor films.

The gate insulating film 1906 is formed using a high-density plasma apparatus. For example, an insulating film having a thickness of 10 nm is formed under the following conditions: a pressure of 20 Pa; a substrate temperature of 325° C.; a gap interval (an interval between a dielectric and the substrate) of 160 mm; a monosilane flow rate of 30 sccm; a nitrous oxide flow rate of 1500 sccm; an argon flow rate of 2500 sccm.

Subsequently, plasma treatment is performed using the high-density plasma apparatus. The plasma treatment is performed under the following conditions: a pressure of 20 Pa; a substrate temperature of 325° C.; a gap interval (an interval between the dielectric and the substrate) of 160 mm; a nitrous oxide flow rate of 1000 sccm; an argon flow rate of 2500 sccm. Through the treatment using high-density plasma, an insulating film which has favorable uniformity and low interface state density is formed without unusual oxidation reaction at a crystal grain boundary. Accordingly, the gate insulating film 1906 which has a thickness of 10 nm and high withstand voltage can be obtained.

In this embodiment, an example in which the thickness of the gate insulating film 1906 is 10 nm is illustrated; however, the thickness of the gate insulating film 1906 is not particularly limited to this thickness. Even a thickness greater than 10 nm and less than 100 nm, an insulating film which has favorable uniformity and low interface state density can be formed.

Next, a mask formed using a resist is formed by photolithography, and an impurity element which imparts p-type conductivity is added to the semiconductor film 1905b which serves as a storage capacitor portion 1900b through the gate insulating film 1906 by ion doping or ion implantation. As the impurity element which imparts p-type conductivity, boron (B), aluminum (Al), gallium (Ga), or the like can be used. Here, boron (B) is used as the impurity element which imparts p-type conductivity and is selectively added so as to be contained at a concentration higher than or equal to $1 \times 10^{19}/cm^3$ and lower than or equal to $1 \times 10^{20}/cm^3$. After boron is added, the mask formed using the resist is removed.

Next, a first conductive film and a second conductive film are stacked over the gate insulating film 1906. Here, the first conductive film is formed to a thickness greater than or equal to 20 nm and less than or equal to 100 nm by CVD, sputtering, or the like. The second conductive film is formed to a thickness greater than or equal to 100 nm and less than or equal to 400 nm. Each of the first conductive film and the second conductive film is formed using an element selected from tantalum (Ta), tungsten (W), titanium (Ti), molybdenum (Mo), aluminum (Al), copper (Cu), chrome (Cr), niobium (Nb), or the like, or an alloy material or a compound material which contains any of the above elements as its main component. Alternatively, each of the first conductive film and the second conductive film is formed using a semiconductor material typified by polycrystalline silicon doped with an impurity element such as phosphorus. As an example of the combination of the first conductive film and the second conductive film, a tantalum nitride film and a tungsten film, a tungsten nitride film and a tungsten film, a molybdenum nitride film and a molybdenum film, or the like can be used. Since tungsten and tantalum nitride have high heat resistance, heat treatment for thermal activation can be performed after the first conductive film and the second conductive film are formed. In addition, in the case of a three-layer structure instead of the two-layer structure, a layered structure of a molybdenum film, an aluminum film, and a molybdenum film may be used.

Next, a resist mask is formed by photolithography, and a gate electrode 1907 is formed above each of the semiconductor films 1905a, 1905b, 1905d, 1905e, and 1905f by etching for forming the gate electrode and a gate line. Here, an example is illustrated in which a layered structure of a first conductive film 1907a and a second conductive film 1907b is provided as the gate electrode 1907.

Next, as illustrated in FIG. 8C, an impurity element which imparts n-type conductivity is added to the semiconductor films 1905a, 1905b, 1905d, 1905e, and 1905f at low concentration by using the gate electrode 1907 as a mask by ion doping or ion implantation. Then, a resist mask is selectively formed by photolithography, and an impurity element which imparts p-type conductivity is added to the semiconductor films 1905b and 1905e at high concentration. As the impurity element which imparts n-type conductivity, phosphorus (P), arsenic (As), or the like can be used. Here, phosphorus (P) is used as the impurity element which imparts n-type conductivity, and phosphorus (P) is introduced into the semiconductor films 1905a, 1905b, 1905d, 1905e, and 1905f so as to be contained at a concentration higher than or equal to $1 \times 10^{18}/cm^3$ and lower than or equal to $1 \times 10^{19}/cm^3$ to form an impurity region 1908 having n-type conductivity. Further, boron (B) is used as the impurity element which imparts p-type conductivity, and boron (B) is introduced into the semiconductor films 1905b and 1905e so as to be contained at a concentration higher than or equal to $1 \times 10^{18}/cm^3$ and lower than or equal to $1 \times 10^{19}/cm^3$ to form an impurity region 1909 having p-type conductivity.

Subsequently, an insulating film is formed so as to cover the gate insulating film 1906 and the gate electrode 1907. The insulating film is formed having a single-layer structure or a layered structure of at least one of a film containing an inorganic material such as silicon, silicon oxide, or silicon nitride, or a film containing an organic material such as an organic resin by plasma enhanced CVD, sputtering, or the like. Next, the insulating film is selectively etched by anisotropic etching that is based on a perpendicular direction to form an insulating film 1910 (also referred to as a sidewall) which is in contact with a side of the gate electrode 1907. The insulating film 1910 is used as a doping mask when a lightly doped drain (LDD) region is formed.

Subsequently, an impurity element which imparts n-type conductivity is added to the semiconductor films 1905a, 1905d, and 1905f at high concentration by using the resist mask which is formed by photolithography, the gate electrode 1907, and the insulating film 1910 as masks to form a high-concentration impurity region 1911 having n-type conductivity. Here, phosphorus (P) is used as the impurity element which imparts n-type conductivity, and phosphorus (P) is selectively introduced into the semiconductor films 1905a, 1905*d*, and 1905*f* so as to be contained at a concentration higher than or equal to 1×10²⁰/cm³ and lower than or equal to 1×10²¹/cm³ to form the high-concentration impurity region 1911, the concentration of n-type impurity element of which is higher than that of the impurity region 1908.

Through the above steps, as illustrated in FIG. 8D, n-channel thin film transistors 1900*a*, 1900*d*, and 1900*f*, a p-channel thin film transistor 1900*e*, and the storage capacitor portion 1900*b* are formed.

Note that as for the thin film transistor 1900*a*, a channel formation region is formed in a region of the semiconductor film 1905*a* which overlaps with the gate electrode 1907; the high-concentration impurity region 1911 which serves as a source region or a drain region is formed in a region which does not overlap with the gate electrode 1907 and the insulating film 1910, and a low-concentration impurity region (an LDD region) is formed in a region which overlaps with the insulating film 1910 and between the channel formation region and the high-concentration impurity region 1911. In a manner similar to that of the thin film transistor 1900*a*, in each of the thin film transistors 1900*d* and 1900*f*, a channel formation region, a low-concentration impurity region, and the high-concentration impurity region 1911 are formed.

As for the thin film transistor 1900*e*, a channel formation region is formed in a region of the semiconductor film 1905*e* which overlaps with the gate electrode 1907, and the high-concentration impurity region 1909 is formed in a region which does not overlap with the gate electrode 1907. Note that although an LDD region is not provided in the thin film transistor 1900*e* here, an LDD region may be provided in the thin film transistor or a structure in which an LDD region is not provided in the thin film transistor 1900*a* may be used.

Further, the storage capacitor portion 1900*b* uses an electrode formed in the same step as the gate electrode 1907 and the semiconductor film 1905*b* as a pair of electrodes and uses the insulating film having a thickness of 10 nm as a dielectric. In the case of transmitting/receiving wireless signals of a UHF band, the total capacitance value of the storage capacitor portion for holding electric charge after an AC signal is rectified and smoothed exceeds 1 nF (1000 pF). Here, the total capacitance value is about 30 nF.

Figure 9A:
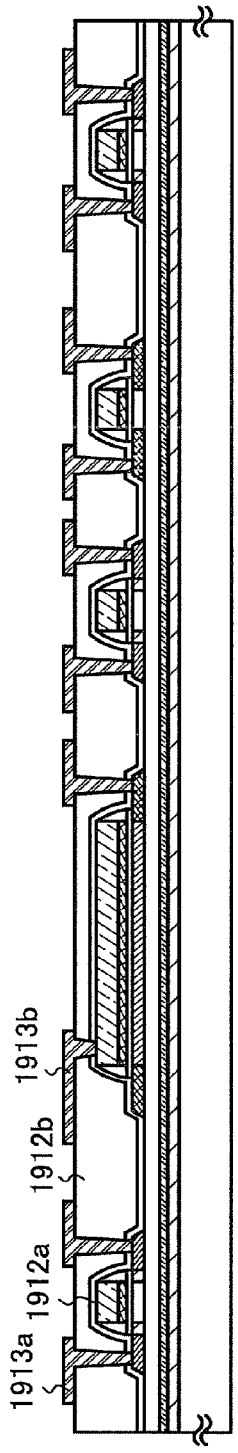
FIGS. 9A to 9C are cross-sectional views illustrating manufacturing steps of the wireless chip.

Next, as illustrated in FIG. 9A, an insulating film is formed having a single-layer structure or a layered structure so as to cover the semiconductor films 1905*a*, 1905*b*, 1905*d*, 1905*e*, and 1905*f*, the gate electrode 1907, and the like, and a conductive film 1913*a* which is electrically connected to the high-concentration impurity regions 1909 and 1911 and a conductive film 1913*b* which is electrically connected to the storage capacitor portion are formed over the insulating film. The insulating film is formed having a single-layer structure or a layered structure using at least one of an inorganic material such as silicon oxide or silicon nitride, an organic material such as polyimide, polyamide, benzocyclobutene, acrylic, or epoxy, a siloxane material, and the like by CVD, sputtering, SOQ a droplet discharge method, screen printing, or the like. Here, the insulating film is formed having a two-layer structure. A silicon nitride oxide film is formed as a first insulating film 1912*a*, and a silicon oxynitride film is formed as a second insulating film 1912*b*. In addition, the conductive films 1913*a* serve as source electrodes or drain electrodes which are electrically connected to the semiconductor films 1905*a*, 1905*d*, 1905*e*, and 1905*f*.

Note that heat treatment for recovery of crystallinity of the semiconductor films, activation of the impurity element which is added to the semiconductor films, or hydrogenation of the semiconductor films is preferably performed before the insulating films 1912*a* and 1912*b* are formed or after one or a plurality of thin films of the insulating films 1912*a* and 1912*b* are formed. Thermal annealing, laser annealing, RTA, or the like is preferably applied to heat treatment.

Further, each of the conductive films 1913*a* and 1913*b* is formed having a single-layer structure or a layered structure of an element selected from aluminum, tungsten, titanium, tantalum, molybdenum, nickel, platinum, copper, gold, silver, manganese, neodymium, carbon, or silicon, or an alloy material or a compound material which contains any of the above elements as its main component. As an alloy material which contains aluminum as its main component, a material which contains aluminum as its main component and contains nickel, or an alloy material which contains aluminum as its main component and contains nickel and one or both of carbon and silicon can be used, for example. For each of the conductive films 1913*a* and 1913*b*, a layered structure of a barrier film, an aluminum silicon (Al—Si) film, and a barrier film or a layered structure of a barrier film, an aluminum silicon (Al—Si) film, a titanium nitride film, and a barrier film is preferably used, for example. Note that a barrier film corresponds to a thin film formed using titanium, titanium nitride, molybdenum, or molybdenum nitride. Since aluminum and aluminum silicon have low resistance values and are inexpensive, they are optimal materials used for the conductive films 1913*a* and 1913*b*.

Next, an interlayer insulating film 1914 is formed so as to cover the conductive films 1913*a* and 1913*b*.

The interlayer insulating film 1914 can be provided having a single-layer structure or a layered structure formed using an insulating film containing oxygen or nitrogen, such as silicon oxide, silicon nitride, silicon oxynitride, or silicon nitride oxide, a film containing carbon such as diamond like carbon (DLC), an organic material such as epoxy, polyimide, polyamide, polyvinyl phenol, benzocyclobutene, or acrylic, or a siloxane material such as a siloxane resin. Note that a siloxane material corresponds to a material containing a Si—O—Si bond. Siloxane has a skeleton structure formed by a bond of silicon (Si) and oxygen (O). As a substituent, an organic group (e.g., an alkyl group or an aromatic hydrocarbon group) or a fluoro group may be used. The organic group may contain a fluoro group.

Next, conductive films 1915*a* and 1915*b* which are electrically connected to the conductive films 1913*a* serving as the source electrodes or the drain electrodes of the thin film transistors 1900*a* and 1900*f* are formed over the interlayer insulating film 1914. In addition, a conductive film 1916*a* which is electrically connected to an electrode of the storage capacitor portion 1900*b* is formed. A conductive film 1916*b* which is electrically connected to the conductive film 1913*a* serving as the source electrode or the drain electrode of the thin film transistor 1900*e* is formed. Note that the conductive films 1915*a* and 1915*b* and the conductive films 1916*a* and 1916*b* may be formed using the same material at the same time. The conductive films 1915*a* and 1915*b* and the conductive films 1916*a* and 1916*b* can be formed using any of the materials described for the conductive films 1913*a* and 1913*b*.

Figure 9B:
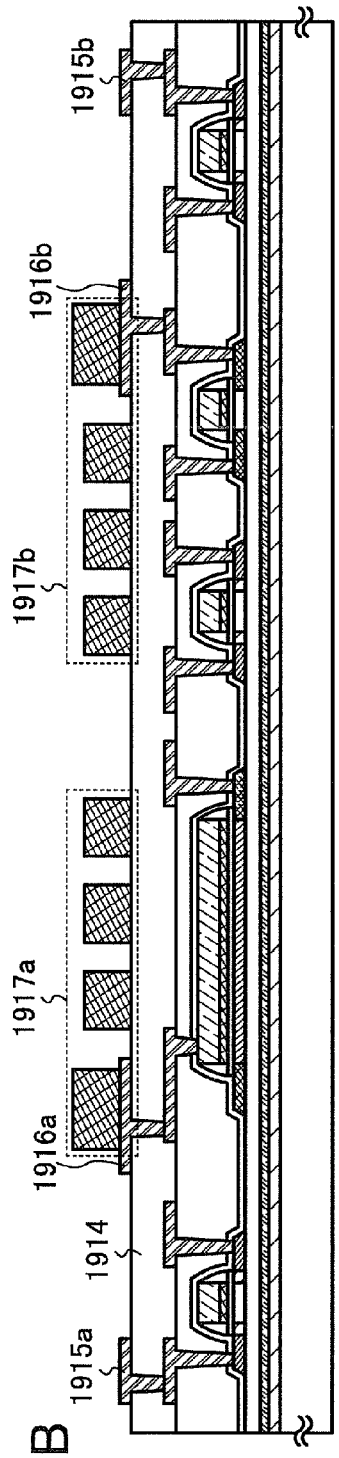

Subsequently, as illustrated in FIG. 9B, conductive films 1917*a* and 1917*b* which function as antennas are formed so as to be electrically connected to the conductive films 1916*a* and 1916*b*.

In addition, each of the conductive films 1917*a* and 1917*b* is formed using a conductive material by CVD, sputtering, a printing method such as screen printing or gravure printing, a droplet discharge method, a dispenser method, a metal plating method, or the like. The conductive material is formed having a single-layer structure or a layered structure of an element selected from aluminum, titanium, silver, copper, gold, platinum, nickel, palladium, tantalum, or molybdenum, or an alloy material or a compound material which contains any of the above elements as its main component.

For example, in the case of forming the conductive films 1917a and 1917b which function as the antennas by screen printing, the conductive films 1917a and 1917b can be provided by selectively printing a conductive paste where a conductive particle having a particle size of several nanometers to several ten micrometers is dissolved or dispersed in an organic resin. As the conductive particle, metal particles of one or more of silver, gold, copper, nickel, platinum, palladium, tantalum, molybdenum, titanium, and the like; a fine particle of silver halide; or a dispersive nano particle can be used. In addition, as the organic resin contained in the conductive paste, one or more selected from organic resins functioning as a binder, a solvent, a dispersive agent, and a coating member of the metal particles can be used. Typically, an organic resin such as an epoxy resin or a silicone resin can be used. Further, in forming the conductive films 1917a and 1917b, baking is preferably performed after the conductive paste is pushed out. For example, in the case of using a fine particle which contains silver as its main component (e.g., a particle size is greater than or equal to 1 nm and less than or equal to 100 nm) as a material for the conductive paste, the conductive films can be obtained by baking them at a temperature in the range of 150 to 300° C. to cure. Alternatively, a fine particle which contains solder or lead-free solder as its main component may be used. In this case, a fine particle having a particle size of 20 µm or less is preferably used. Solder and lead-free solder each have an advantage such as low cost.

Figure 9C:
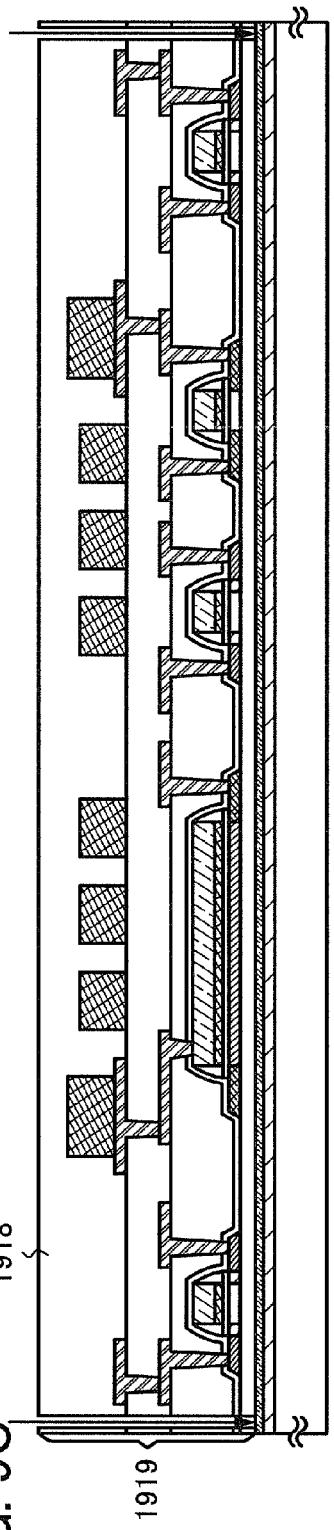

Next, as illustrated in FIG. 9C, after an insulating film 1918 is formed so as to cover the conductive films 1917a and 1917b, a layer which includes the thin film transistors 1900a, 1900d, 1900e, and 1900f, the storage capacitor portion 1900b, the conductive films 1917a and 1917b, and the like (hereinafter referred to as an element formation layer 1919) is separated from the substrate 1901. Here, the element formation layer 1919 can be separated from the substrate 1901 by using physical force after opening portions are formed in regions excluding the regions of the thin film transistors 1900a, 1900d, 1900e, and 1900f, and the storage capacitor portion 1900b by irradiation with a laser beam (e.g., UV light).

The insulating film 1918 can be provided with a single-layer structure or a layered structure formed using an insulating film containing oxygen or nitrogen, such as silicon oxide, silicon nitride, silicon oxynitride, or silicon nitride oxide, a film containing carbon such as diamond like carbon (DLC), an organic material such as epoxy, polyimide, polyamide, polyvinyl phenol, benzocyclobutene, or acrylic, or a siloxane material such as a siloxane resin.

In this embodiment, as illustrated in FIG. 10A, after the opening portion is formed in the element formation layer 1919 by irradiation with a laser beam, a sheet material 1920 is attached to one surface of the element formation layer 1919 (a surface in which the insulating film 1918 is exposed). Then, the element formation layer 1919 is separated from the substrate 1901.

Next, as illustrated in FIG. 10B, a second sheet material 1921 is attached to the other surface of the element formation layer 1919 (a surface which is exposed by the separation) by performing one or both of heat treatment and pressure treatment. The whole circumference of the element formation layer 1919 is preferably covered with the sheet material 1921. As each of the first sheet material 1920 and the second sheet material 1921, a hot melt film or the like can be used.

Alternatively, a resin including a fibrous body may be used as the second sheet material 1921. A fibrous body refers to a woven cloth or nonwoven cloth using high-strength fiber of an organic compound or an inorganic compound. As typical examples of high-strength fiber, there are polyvinyl alcohol fiber, polyester fiber, polyamide fiber, polyethylene fiber, aramid fiber, polyparaphenylene benzobisoxazole fiber, glass fiber, and carbon fiber. As glass fiber, glass fiber using E glass, S glass, D glass, Q glass, or the like can be used. Note that the fibrous body may be formed using one kind of the above high-strength fiber or a plurality of the above high-strength fibers. By using the resin including the fibrous body, reliability in high temperature and high humidity can be improved.

Alternatively, as the second sheet material 1921, paper can be used. Further, the element formation layer 1919 can be embedded in one sheet of paper. As a method for embedding the element formation layer 1919 in paper, a method for embedding the element formation layer 1919 in multilayer paper is preferable.

Alternatively, as each of the first sheet material and the second sheet material 1921, a material on which antistatic treatment for preventing static electricity or the like is performed (hereinafter referred to as an antistatic material) can be used. As an antistatic material, there are a film in which an antistatic material is dispersed in a resin, a film to which an antistatic material is attached, and the like. As a film in which an antistatic material is provided, a film in which an antistatic material is provided over one surface may be used, or a film in which an antistatic material is provided over opposite surfaces may be used. In addition, as for the film in which the antistatic material is provided over one surface, the surface over which the antistatic material is provided may be attached to the element formation layer 1919 so as to be inside the film, or may be attached to the element formation layer 1919 so as to be outside the film. Note that the antistatic material may be provided on the entire surface or part of the surface. Here, as the antistatic material, metal, indium tin oxide (ITO), or a surfactant such as an ampholytic surface active agent, a cationic surface active agent, or a nonionic surface active agent can be used. Alternatively, as the antistatic material, a resin material containing a cross-linked copolymer which has a carboxyl group and quaternary ammonium base on its side chain, or the like can be used. By attaching any of these materials to the film, kneading any of these materials into the film, or applying any of these materials to the film, the antistatic film can be completed. By performing sealing with the antistatic film, a semiconductor element can be prevented from being adversely affected by static electricity or the like from outside when the semiconductor device is handled as a product.

Subsequently, divide is performed if necessary so that the semiconductor devices are cut out.

Although an example in which the element formation layer 1919 is used by being separated from the substrate 1901 is described in this embodiment, the element formation layer 1919 may be formed over the substrate 1901 without providing the separation layer 1903 and may be used as a semiconductor device. Note that in the case of using an SOI (silicon on insulator) substrate as the substrate 1901, because a single crystal semiconductor film can be used as a semiconductor film, time needed for the steps of crystallizing the semiconductor film can be eliminated.

As described above, by using the manufacturing method of this embodiment, a small semiconductor device which has flexibility in the physical shape and higher reliability can be provided.

In particular, since the thickness of the insulating film can be uniformly 10 nm by using the high-density plasma apparatus, capacitance can be ensured with a relatively small plane area and variation in total capacitance value of the storage capacitor portion can be reduced. Further, since the thickness of a gate insulating film of a thin film transistor used for a circuit can be uniformly 10 nm, a gradient in a rise portion of I-V characteristics curve becomes steep, so that the threshold voltage of the thin film transistor can be lowered. By lowering the threshold voltage of the thin film transistor, the circuit can be operated at low voltage or can be operated at high speed. In a wireless chip, by providing a circuit which can be operated at low voltage, communication distance can be extended. In a wireless chip of this embodiment, voltage which is output through a wireless signal to a constant voltage circuit is lower than 2 V.

Embodiment 2

Figure 11A:
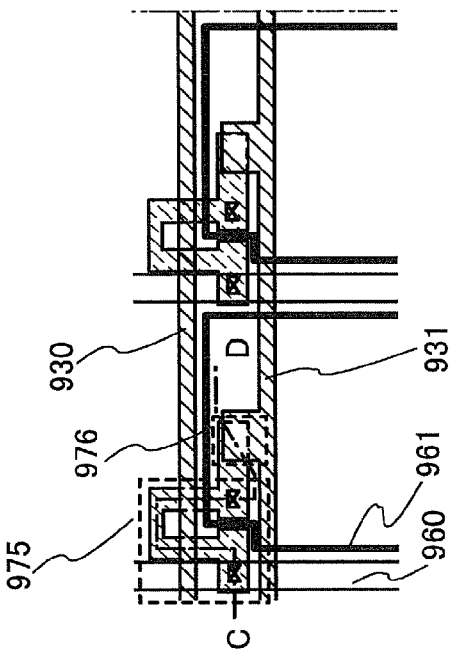
FIG. 11A is a top view of a liquid crystal display device.
Figure 11B:
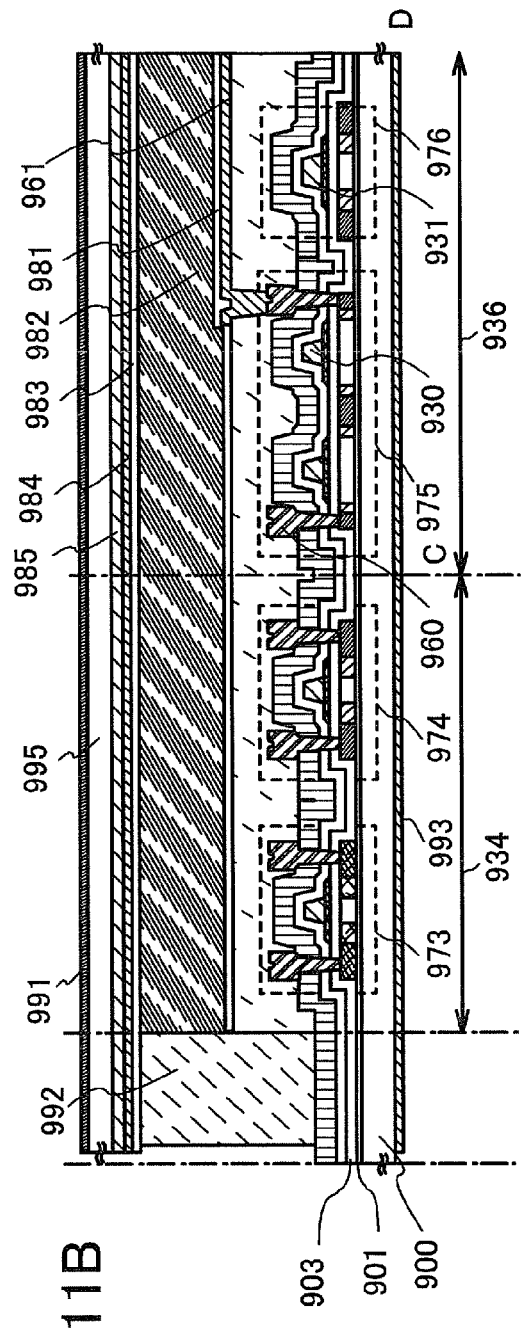
FIG. 11B is a cross-sectional view of the liquid crystal display device.

In this embodiment, an example of a semiconductor device using a liquid crystal element is described with reference to FIGS. 11A and 11B.

Over a light-transmitting substrate 900, thin film transistors are formed in a pixel portion 936 and a driver circuit 934. In addition, a storage capacitor 976 is formed in the pixel portion 936.

Since a drive voltage higher than or equal to 5 V and lower than or equal to 10 V is used in the pixel portion 936, a thin film transistor 975 provided in the pixel portion 936 preferably has a structure suitable for operation at a drive voltage higher than or equal to 5 V and lower than or equal to 10 V. As for the thin film transistor 975 used in the pixel portion 936, the thickness of a gate insulating film is made at least larger than that of the thin film transistor which is mounted on the wireless chip illustrated in Embodiment 1. In addition, in order to prevent burn-in, negative voltage and positive voltage are alternately applied to a pixel electrode of a liquid crystal element. Further, the storage capacitor 976 in each pixel is about 0.2 pF to several picofarads.

After a base insulating film 901 which serves as a barrier film is formed over the light-transmitting substrate 900, an amorphous semiconductor film is formed and is crystallized by a known crystallization technique to form a crystalline semiconductor film. Subsequently, the crystalline semiconductor film is selectively etched to form a plurality of island-shaped semiconductor layers, and an insulating film 903 is formed over the plurality of island-shaped semiconductor layers. In this embodiment, the thickness of the insulating film 903 can be uniformly 30 nm by using a high-density plasma apparatus. Even though the insulating film 903 is formed to a thickness of 30 nm, which is thin, the insulating film 903 can have a structure suitable for operation at a drive voltage higher than or equal to 5 V and lower than or equal to 10 V. Further, a thin film transistor having high long-term reliability can be provided. Furthermore, by thinning the insulating film 903, storage capacitance in each pixel can be ensured with a small electrode area, which contributes to improvement in aperture ratio of the pixel portion.

In this embodiment, an example in which the thickness of the insulating film 903 is 30 nm is illustrated; however, the thickness of the insulating film 903 is not particularly limited to this thickness. Even a thickness greater than 30 nm and less than 100 nm, a thin film transistor having high long-term reliability can be provided.

Then, after a conductive film is formed, the conductive film is selectively etched to form a gate electrode 930 and a capacitor wiring 931. Subsequently, an impurity element which imparts n-type or p-type conductivity is added to the island shaped semiconductor layer as appropriate so that an impurity region is formed. In this embodiment, a two-layer conductive film is selectively etched; then, a low-concentration impurity region is formed by adding phosphorus and part of the conductive film is etched to have an electrode shape illustrated in FIG. 11B; and then, a high-concentration impurity region is formed by adding phosphorus by using a resist mask which covers part of the thin film transistor 975 in the pixel portion and a thin film transistor 973 as a mask. Then, a resist mask which covers a region where a thin film transistor 974, the thin film transistor 975, and the storage capacitor 976 are formed is formed; and a source region or a drain region of the p-channel thin film transistor 973 is formed by adding boron. In this embodiment, the storage capacitor 976 is a capacitor which uses the insulating film 903 as a dielectric and uses the island-shaped semiconductor layer having the high-concentration impurity region to which phosphorus is added and the capacitor wiring 931 as a pair of electrodes.

Subsequently, the gate electrode 930 and the capacitor wiring 931 are covered with an interlayer insulating film. Then, after contact holes which reach the plurality of island-shaped semiconductor layers are formed, a source wiring 960, an electrode, and the like which are electrically connected to the plurality of island-shaped semiconductor layers are formed over the interlayer insulating film.

Subsequently, a planarization film is formed over the interlayer insulating film; a contact hole which reaches a source electrode or a drain electrode of the thin film transistor 975 is formed; and a pixel electrode 961 which is electrically connected to the source electrode or the drain electrode of the thin film transistor 975 is formed.

Subsequently, an alignment film 981 which covers the pixel electrode 961 is formed in the pixel portion by screen printing or inkjet.

Through the above steps, the substrate having the transistors in the pixel portion is manufactured. Subsequently, a counter substrate 995 having a counter electrode 984 and the substrate 900 are attached to each other with a sealant 992. Note that before the counter substrate 995 and the substrate 900 are attached to each other, an alignment film 983 which covers a color filter 985 and the counter electrode 984 is formed on the counter substrate 995. In the case of using a liquid crystal dropping method, liquid crystals are dropped onto a region surrounded by the sealant 992 with a closed loop, and the pair of substrates is attached to each other under reduced pressure. In this manner, the pair of substrates and the region surrounded by the sealant are filled with a liquid crystal layer 982.

Subsequently, an optical film such as a polarizing plate 993 is formed on the substrate 900, and an optical film such as a polarizing plate 991 is formed over the substrate 995.

Through the above steps, a liquid crystal panel is manufactured.

Embodiment 3

In this embodiment, an example of a semiconductor device using an organic light-emitting element is described with reference to FIGS. 12A to 12E and FIG. 13.

Here, an SOI substrate using a glass substrate is manufactured, and an organic light-emitting element is formed. First, a buffer layer 102 is formed over a semiconductor wafer 101. In this embodiment, a 12-inch single crystal silicon wafer (having a diameter of about 300 mm) whose crystal orientation is (100) is used as the semiconductor wafer 101.

As a circular single crystal semiconductor wafer, there are a semiconductor wafer of silicon, germanium, or the like; a compound semiconductor wafer of gallium arsenide, indium phosphide, or the like; and the like. Needless to say, a single crystal semiconductor substrate is not limited to a circular wafer, and single crystal semiconductor substrates having various shapes can be used. For example, a polygonal substrate such as a rectangular substrate, a pentagonal substrate, a hexagonal substrate, or the like can be used.

In addition, a rectangular single crystal semiconductor substrate can be formed by cutting a commercial circular single crystal semiconductor wafer. The substrate can be cut with a cutting device such as a dicer or a wire saw, laser cutting, plasma cutting, electron beam cutting, or any other cutting means. Alternatively, a rectangular single crystal semiconductor substrate can be formed in such a way that an ingot for manufacturing a semiconductor substrate before being sliced into a substrate is processed into a rectangular solid so as to have a rectangular section and this rectangular solid ingot is sliced. Further, although the thickness of the single crystal semiconductor substrate is not particularly limited to certain thickness, a thick single crystal semiconductor substrate is preferable because many single crystal semiconductor layers can be formed from one material wafer, in consideration of the reuse of the single crystal semiconductor substrate. The thickness and the size of single crystal silicon wafers distributing in the market conform to SEMI standards, which specify that, for example, a wafer with a diameter of 6 inches has a thickness of 625 μm, a wafer with a diameter of 8 inches has a thickness of 725 μm, and a wafer with a diameter of 12 inches has a thickness of 775 μm. Note that the thickness of a wafer conforming to SEMI standards has a tolerance of ±25 μm. Needless to say, the thickness of the single crystal semiconductor substrate which is to be a material is not limited to the thickness conforming to SEMI standards, and the thickness can be adjusted as appropriate when an ingot is sliced. Needless to say, when the single crystal semiconductor substrate is reused, the thickness thereof is thinner than the thickness conforming to SEMI standards.

The buffer layer 102 can be formed using a single film or two or more films. If sufficient flatness can be obtained, an insulating film containing silicon or germanium, such as a silicon oxide film, a silicon oxynitride film, a silicon nitride oxide film, a silicon nitride film, a germanium oxide film, a germanium nitride film, a germanium oxynitride film, or a germanium nitride oxide film formed by PECVD or sputtering can be used for the buffer layer 102. Alternatively, a silicon oxide film which is formed using an organosilane gas and oxygen as a process gas by PECVD may be used for the buffer layer 102. Alternatively, a thermal oxidation film obtained by thermal oxidation can be used. Note that the thermal oxidation film obtained by thermal oxidation is formed on a front surface and a rear surface of the wafer and a surface including an end face.

Alternatively, an insulating film including metal oxide such as aluminum oxide, tantalum oxide, or hafnium oxide; an insulating film including metal nitride such as aluminum nitride; an insulating film including metal oxynitride, such as an aluminum oxynitride film; or an insulating film including metal nitride oxide, such as an aluminum nitride oxide film, can be used for the buffer layer 102.

Note that in this specification, oxynitride refers to a material which contains much oxygen than nitrogen. Further, nitride oxide refers to a material which contains much nitrogen than oxygen. Note that a silicon oxynitride film refers to a film which contains much oxygen than nitrogen and contains oxygen, nitrogen, silicon, and hydrogen at concentrations ranging from 50 to 70 atomic percent, 0.5 to 15 atomic percent, 25 to 35 atomic percent, and 0.1 to 10 atomic percent, respectively, in the case where measurement is performed using Rutherford backscattering spectrometry (RBS) and hydrogen forward scattering (HFS). Further, a silicon nitride oxide film refers to a film which contains much nitrogen than oxygen and contains oxygen, nitrogen, silicon, and hydrogen at concentrations ranging from 5 to 30 atomic percent, 20 to 55 atomic percent, 25 to 35 atomic percent, and 10 to 30 atomic percent, respectively, in the case where measurement is performed using RBS and HFS. Note that percentages of nitrogen, oxygen, silicon, and hydrogen fall within the ranges given above if the total number of atoms contained in silicon oxynitride or silicon nitride oxide is defined as 100 atomic percent.

In this embodiment, as the buffer layer 102, a two-layer structure is used in which a silicon nitride film (having a thickness of 50 nm) is stacked over a silicon oxide film (having a thickness of 100 nm) formed by PECVD. Note that it is undesirable to form a silicon nitride film on and in contact with the semiconductor wafer 101 in terms of characteristics of a transistor which is to be formed later. Thus, a silicon oxide film is provided between the silicon nitride film and the semiconductor wafer 101. Alternatively, instead of the silicon nitride film, a silicon nitride oxide film may be used.

In the case of using nitride oxide, for example, a silicon nitride film or a silicon nitride oxide film as at least one layer of the buffer layer 102, a transistor having high electron mobility can be formed over the buffer layer 102 by using lattice distortion in Si, which is generated by the film stress of the buffer layer 102.

Figure 12A:
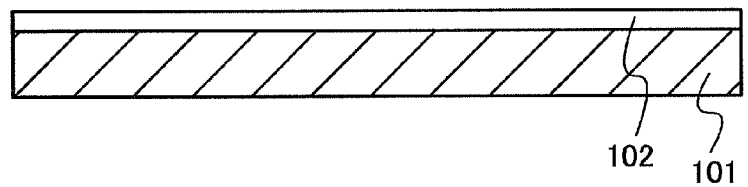
FIGS. 12A to 12E are cross-sectional views illustrating manufacturing steps of a light-emitting display device.
Figure 12B:
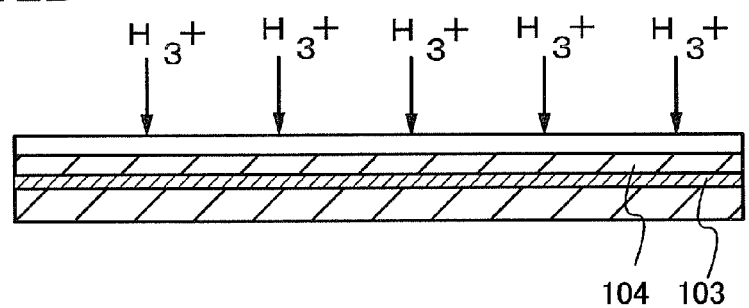

A cross-sectional process view up to this step corresponds to FIG. 12A.

Subsequently, the semiconductor wafer 101 is irradiated with $H_3^+$ ions through the buffer layer 102 by using an ion doping apparatus. The conditions of this doping are as follows: power output is 100 W; accelerating voltage is 35 kV; dosage is $2.2 \times 10^{16}$ ions/cm². The ion doping apparatus rotates the semiconductor wafer 101 in order to make the distribution of addition of ions uniform. A separation layer 103 containing a large amount of hydrogen is formed by irradiation with $H_3^+$ ions. In addition, a single crystal semiconductor layer 104 is formed between the separation layer 103 and the buffer layer 102. A cross-sectional process view up to this step corresponds to FIG. 12B. The thickness of the single crystal semiconductor layer 104 is determined depending on the position of the separation layer 103 in a depth direction. Accordingly, the thickness of the single crystal semiconductor layer 104 depends on the doping conditions (the accelerating voltage and the like) of $H_3^+$ ions. With a high proportion of $H_3^+$ ions to the total hydrogen ion species used for irradiation, efficiency can be increased and irradiation time can be shortened.

Subsequently, the semiconductor wafer 101 over which the buffer layer 102 is formed is subjected to ultrasonic cleaning in pure water.

Subsequently, after a surface of the buffer layer 102 is cleaned, when one surface of a glass substrate 105 and the surface of the buffer layer 102 are disposed in close contact with each other and at least one portion is lightly pressed from outside, a distance between the surfaces which are bonded to each other is locally decreased. Thus, van der Waals force is increased; hydrogen bonding also contributes; and the semiconductor wafer 101 and the glass substrate 105 attract each other so that they are bonded to each other. Further, since the distance between the facing substrates is also decreased in an adjacent region, a region on which van der Waals force strongly act or a region which is influenced by hydrogen bonding spreads. Thus, bonding proceeds and spreads over the entire bonding surface. Note that the one surface of the glass substrate 105, which is to be bonded to the surface of the buffer layer 102, is cleaned sufficiently.

Further, before the surface of the semiconductor wafer 101, over which the buffer layer is formed, and the one surface of the glass substrate 105 are disposed in close contact with each other, the surfaces may be cleaned with pure water containing ozone.

In addition, before the surface of the semiconductor wafer 101, over which the buffer layer is formed, and the one surface of the glass substrate 105 are disposed in close contact with each other, an insulating film which serves as one layer of the buffer layer may also be formed over the semiconductor wafer 101. Alternatively, before the surface of the semiconductor wafer 101, over which the buffer layer is formed, and the one surface of the glass substrate 105 are disposed in close contact with each other, an insulating film which serves as one layer of the buffer layer may also be formed over the glass substrate 105.

After the semiconductor wafer 101 and the glass substrate 105 are bonded to each other with the buffer layer 102 interposed therebetween, heat treatment or pressure treatment is preferably performed. By performing heat treatment or pressure treatment, bonding strength can be increased. Heating temperature here is a temperature at which elements or molecules added to the separation layer 103 are not precipitated and is preferably lower than or equal to 350° C. That is, this heating temperature is a temperature at which gas is not released from the separation layer 103. In the case of performing pressure treatment, pressure treatment is performed so that pressure is applied in a direction perpendicular to the surfaces which are bonded to each other, in consideration of the pressure resistance of the semiconductor wafer 101 and the glass substrate 105.

Figure 12C:
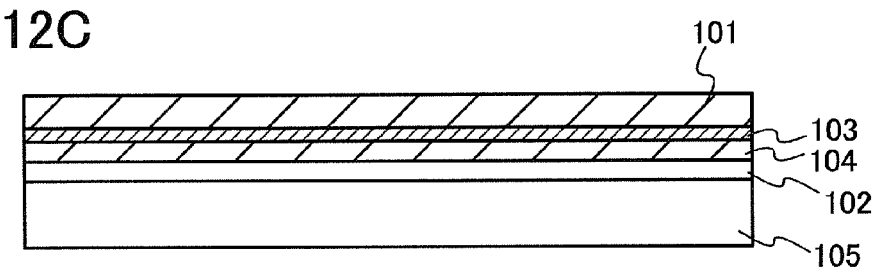

A cross-sectional process view up to this step corresponds to FIG. 12C.

Subsequently, by performing heat treatment at higher than or equal to 400° C. and lower than or equal to 600° C., the volume of microvoids formed in the separation layer 103 is changed and cleaves along the separation layer 103. For heat treatment here, a rapid thermal anneal (RTA) apparatus, a resistance heating furnace, or a microwave heating apparatus can be used. As an RTA apparatus, a gas rapid thermal anneal (GRTA) apparatus or a lamp rapid thermal anneal (LRTA) apparatus can be used. By this heat treatment, the temperature of the glass substrate 105 to which the single crystal semiconductor layer 104 is attached is preferably raised in the range of 550 to 650° C.

In this embodiment, heat treatment is performed using a vertical furnace having resistance heating. The glass substrate 105 to which the semiconductor wafer 101 is attached is placed in a boat for the vertical furnace. The boat is carried into a chamber of the vertical furnace. In order to suppress the oxidation of the semiconductor wafer 101, the chamber is first exhausted to be in a vacuum state. The degree of vacuum is approximately $5 \times 10^{-3}$ Pa. After making the chamber in a vacuum state, the chamber is supplied with nitrogen so as to be in a nitrogen atmosphere under atmospheric pressure. During this, the temperature is raised to 200° C.

After the chamber is set in a nitrogen atmosphere under atmospheric pressure, heating is performed at 200° C. for two hours. Then, the temperature is raised to 400° C. for an hour. When the state at a heating temperature of 400° C. is stabilized, the heating temperature is raised to 600° C. for an hour. When the state at a heating temperature of 600° C. is stabilized, heat treatment is performed at 600° C. for two hours. After that, the heating temperature is lowered to 400° C. in an hour. After 10 to 30 minutes, the boat is carried out from the chamber. Under the atmosphere, the semiconductor wafer 101 and the glass substrate 105 to which the semiconductor wafer 101 is attached on the boat are cooled.

In the above heat treatment using a resistance heating furnace, heat treatment for increasing bonding strength between the semiconductor wafer 101 and the glass substrate 105 and heat treatment for causing separation in the separation layer 103 or at an interface of the separation layer 103 are performed successively. In the case of performing these two heat treatments in different apparatuses, for example, after heat treatment is performed at a heating temperature of 200° C. for two hours in a resistance heating furnace, the glass substrate 105 and the semiconductor wafer 101 which are attached to each other are carried out from the furnace. Next, heat treatment is performed at a heating temperature higher than or equal to 600° C. and lower than or equal to the strain point of the glass substrate 105 for 1 to 30 minutes with an RTA apparatus, so that the semiconductor wafer 101 is separated at the separation layer 103.

In order to firmly bond the semiconductor wafer 101 and the glass substrate 105 to each other by low-temperature treatment at lower than or equal to 700° C., it is preferable that OH groups or water molecules ($H_2O$) exist on the surface of the buffer layer 102 and the surface of the glass substrate 105. This is because the bonding between the buffer layer 102 and the glass substrate 105 starts from the formation of covalent bonds (covalent bonds of oxygen molecules and hydrogen molecules) or hydrogen bonds of the OH groups or the water molecules.

Figure 12D:
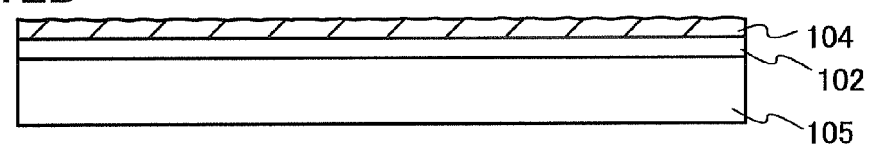

Through the above steps, an SOI substrate illustrated in FIG. 12D can be obtained. The SOI substrate illustrated in FIG. 12D has the buffer layer 102 over the glass substrate 105 and the single crystal semiconductor layer 104 over the buffer layer 102. The thickness of the single crystal semiconductor layer 104 can be equal to or less than 100 nm. When the thickness of the single crystal semiconductor layer 104 is equal to or less than 100 nm, the thickness is less than the maximum depth of a depletion layer in a channel formation region of a transistor, which results in significant electric characteristics of the transistor. When a sufficient depletion layer is obtained in the transistor, subthreshold swing, threshold voltage, and the like which are almost ideal can be obtained. Further, in the case where a CMOS structure is formed, high switching speed can be obtained.

Subsequently, treatment for improving flatness or recovering crystallinity of the single crystal semiconductor layer 104 is performed. As treatment for improving flatness, chemical mechanical polishing (abbreviation: CMP) or irradiation with a laser beam is performed. Note that in the case of performing irradiation with a laser beam, etching treatment is preferably performed on a surface of the single crystal semiconductor layer 104 before the irradiation.

Figure 12E:
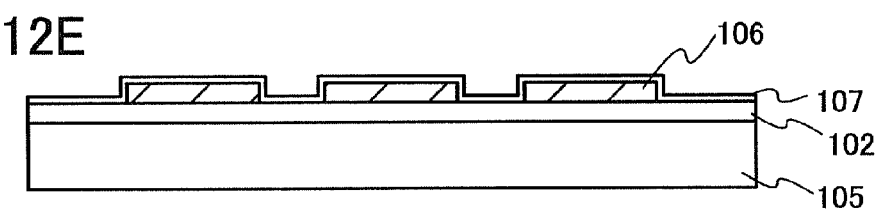

Subsequently, the single crystal semiconductor layer 104 is selectively etched to form an island-shaped semiconductor layer 106, and a gate insulating film 107 which covers the island-shaped semiconductor layer 106 is formed. A cross-sectional view through the steps up to here is illustrated in FIG. 12E. The gate insulating film is formed using a high-density plasma apparatus in a manner similar to that of Embodiment 1 or Embodiment 2. After an insulating film having a thickness of 10 nm is deposited using the high-density plasma apparatus, plasma treatment is performed using the high-density plasma apparatus. Through the treatment using high-density plasma, an insulating film which has favorable uniformity and low interface state density is formed without unusual oxidation reaction at a crystal grain boundary.

In this embodiment, an example in which the thickness of the gate insulating film 107 is 10 nm is illustrated; however, the thickness of the gate insulating film 107 is not particularly limited to this thickness. Even a thickness greater than 10 nm and less than 100 nm, an insulating film which has favorable uniformity and low interface state density can be formed.

Subsequently, a gate electrode which overlaps with the island-shaped semiconductor layer 106 is formed over the gate insulating film 107. Then, a thin film transistor using the gate electrode is formed. After that, by forming a light-emitting element 1605 which is electrically connected to the thin film transistor and performing sealing, a light-emitting display device illustrated in FIG. 13 can be manufactured.

Figure 13:
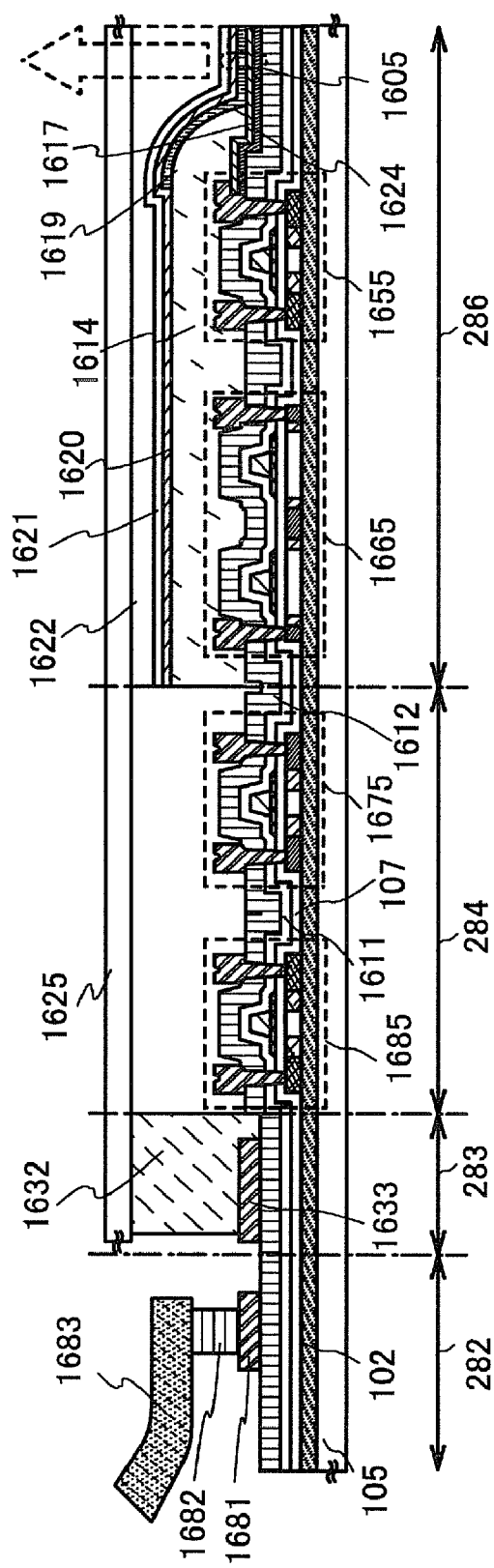
FIG. 13 is a cross-sectional view illustrating a manufacturing step of the light-emitting display device.

A light-emitting display device illustrated in FIG. 13 has a top emission structure in which light is emitted in a direction indicated by an arrow in FIG. 13. The light-emitting display device illustrated in FIG. 13 includes the glass substrate 105, the buffer layer 102, thin film transistors 1655, 1665, 1675, and 1685, a wiring layer 1624, a first electrode layer 1617, a light-emitting layer 1619, a second electrode layer 1620, a transparent conductive film 1621, a filler 1622, a sealant 1632, the gate insulating film 107, insulating films 1611, 1612, and 1614, a sealing substrate 1625, a wiring layer 1633, a terminal electrode layer 1681, an anisotropic conductive layer 1682, and an FPC 1683.

In FIG. 13, a semiconductor device includes an external terminal connection region 282, a sealing region 283, a driver circuit region 284, and a pixel region 286. The wiring layer 1624 which is a reflective metal layer is provided below the first electrode layer 1617. The first electrode layer 1617 which is a transparent conductive film is formed over the wiring layer 1624. Since it is acceptable as long as the wiring layer 1624 has reflectiveness, a conductive film formed using titanium, tungsten, nickel, gold, platinum, silver, copper, tantalum, molybdenum, aluminum, magnesium, calcium, or lithium, an alloy thereof, or the like may be used. A material having high reflectiveness in a visible light range is preferably used. Further, a conductive film may be used as the first electrode layer 1617. In that case, the wiring layer 1624 having reflectiveness is not necessarily provided.

For each of the first electrode layer 1617 and the second electrode layer 1620, in specific, a transparent conductive film formed using a conductive material having a light-transmitting property is preferably used. Indium oxide containing tungsten oxide, indium zinc oxide containing tungsten oxide, indium oxide containing titanium oxide, or indium tin oxide containing titanium oxide can be used. Needless to say, indium tin oxide (ITO), indium zinc oxide (IZO), indium tin oxide to which silicon oxide is added (ITSO), or the like can be used.

Further, even if a material having no light-transmitting property, such as a metal film is used, light can be emitted through the first electrode layer 1617 and the second electrode layer 1620 by decreasing the thickness of the material (preferably a thickness of about 5 to 30 nm) so that light can be transmitted. Further, as a metal thin film which can be used for each of the first electrode layer 1617 and the second electrode layer 1620, a conductive film formed using titanium, tungsten, nickel, gold, platinum, silver, aluminum, magnesium, calcium, or lithium, or an alloy thereof, or the like can be used.

A color filter (a coloring layer) may be formed on the sealing substrate. A color filter (a coloring layer) can be formed by vapor deposition or a droplet discharge method. By using the color filter (the coloring layer), high-definition display can be performed. This is because a broad peak can be corrected to a sharp peak in an emission spectrum of each of R, G, and B by the color filter (the coloring layer).

Full color display can be performed by forming a material emitting light of a single color and combining the material with a color filter or a color conversion layer. For example, the color filter (the coloring layer) or the color conversion layer may be formed on the sealing substrate and then attached to the glass substrate 105.

Needless to say, monochrome display may be performed. For example, an area color type semiconductor device may be formed using single color light emission. A passive matrix display portion is suitable for the area color type, and characters or symbols can be mainly displayed.

By using the single crystal semiconductor layer, the pixel region and the driver circuit region can be formed over the same substrate. In that case, the transistors in the pixel region and the transistors in the drive circuit region are formed concurrently.

Further, by using the gate insulating film formed using the high-density plasma apparatus, the gate insulating film can be thinned and the single crystal semiconductor layer is used for the thin film transistor. Thus, a light-emitting display device which can be driven at low power consumption can be provided.

This embodiment can be freely combined with any of Embodiment Mode, Embodiment 1, and Embodiment 2.

Embodiment 4

Figure 14:
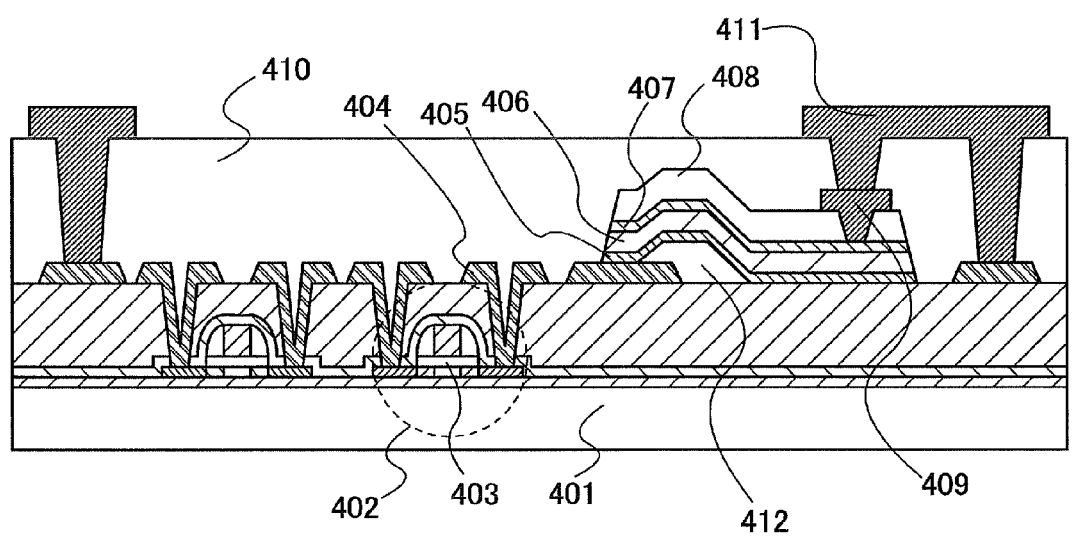
FIG. 14 is a cross-sectional view of a photoelectric conversion device.

In this embodiment, an example of a photoelectric conversion device using a thin film transistor and a photodiode is described with reference to FIG. 14.

In the photoelectric conversion device illustrated in this embodiment, a photodiode and an amplifier circuit formed using a thin film transistor are formed over the same substrate.

A thin film transistor 402 is formed over a glass substrate 401. Note that a gate insulating film 403 of the thin film transistor is formed using a high-density plasma apparatus in a manner similar to that of Embodiment 1 or Embodiment 2. After an insulating film having a thickness of 20 nm is formed using the high-density plasma apparatus, plasma treatment is performed using the high-density plasma apparatus. Through the treatment using high-density plasma, the gate insulating film 403 which has favorable uniformity and low interface state density is formed without unusual oxidation reaction at a crystal grain boundary.

In this embodiment, an example in which the thickness of the gate insulating film 403 is 20 nm is illustrated; however, the thickness of the gate insulating film 403 is not particularly limited to this thickness. Even a thickness greater than 20 nm and less than 100 nm, the gate insulating film 403 which has favorable uniformity and low interface state density can be formed.

Subsequently, an electrode which is connected to the thin film transistor 402 is formed. Any electrode can be used as long as it is formed using a conductive material; however, it is preferable to use a conductive metal film which does not easily become an alloy by reaction with a photoelectric conversion layer (typically amorphous silicon) which is to be formed later. Next, etching is performed so that an end portion of the electrode is tapered to form an electrode 404. At this time, the electrode 404 is formed to have a taper angle less than or equal to 80°, preferably less than or equal to 45°. Accordingly, coverage with the photoelectric conversion layer which is to be formed later is improved, so that reliability can be improved. Further, an insulator 412 which overlaps with an end portion of the electrode 404 is formed.

Next, a p-type semiconductor film is formed. In this embodiment, as the p-type semiconductor film, for example, a p-type amorphous semiconductor film is formed. As the p-type amorphous semiconductor film, an amorphous silicon film containing an impurity element belonging to Group 13 of the periodic table, for example, boron (B) is formed by plasma enhanced CVD.

After the p-type semiconductor film is formed, an i-type semiconductor film (also referred to as an intrinsic semiconductor film), which does not contain an impurity which imparts conductivity, and an n-type semiconductor film are sequentially formed. In this embodiment, the p-type semiconductor film is formed to a thickness greater than or equal to 10 nm and less than or equal to 50 nm; the i-type semiconductor film is formed to a thickness greater than or equal to 200 nm and less than or equal to 1000 nm; and the n-type semiconductor film is formed to a thickness greater than or equal to 20 nm and less than or equal to 200 nm.

As the i-type semiconductor film, for example, an amorphous silicon film may be formed by plasma enhanced CVD. Further, as the n-type semiconductor film, an amorphous silicon film containing an impurity element belonging to Group 15 of the periodic table, for example, phosphorus (P) may be formed. Alternatively, an impurity element belonging to Group 15 of the periodic table may be introduced after an amorphous silicon film is formed.

Note that the p-type semiconductor film, the i-type semiconductor film, and the n-type semiconductor film may be stacked in a reverse order. That is, the n-type semiconductor film, the i-type semiconductor film, and the p-type semiconductor film may be stacked in that order.

Next, an insulating film 408 and an electrode 409 are formed by screen printing. Alternatively, the insulating film 408 and the electrode 409 may be formed by inkjet. Alternatively, the insulating film 408 and the electrode 409 may be formed over the entire surface and processed into desired shapes by photolithography. In this embodiment, an epoxy resin is used for the insulating film 408, and nickel (Ni) is used for the electrode 409. Note that when nickel (Ni) is formed by screen printing, a conductive paste containing nickel is used.

Next, the p-type semiconductor film, the i-type semiconductor film, and the n-type semiconductor film are etched using the insulating film 408 and the electrode 409 as a mask to form a p-type semiconductor layer 405, an i-type semiconductor layer 406, and an n-type semiconductor layer 407. Due to overetching in this etching, a film of the electrode 404 is also etched in some cases. In such a case, a problem such as decrease in conductivity occurs. Therefore, etching selectivity between the electrode 404, and the p-type semiconductor film, the i-type semiconductor film, and the n-type semiconductor film is preferably high.

Next, an insulating film 410 and an electrode 411 are formed by screen printing. In this embodiment, an epoxy resin is used for the insulating film 410, and the electrode 411 is formed having a layered structure of nickel (Ni) and copper (Cu) for improvement in wettability to solder and improvement in intensity in mounting.

In the case where light enters from the glass substrate 401 side, light is made to interfere by adjusting the thickness of a plurality of insulating films having different refraction indexes, which are included in the thin film transistor 402, so that the wavelength distribution of light that enters the photoelectric conversion layer can be controlled. By adjusting the wavelength distribution of light so as to be close to eye-spectral sensitivity as much as possible, the photoelectric conversion device can be used as a visible light sensor having high accuracy.

The photoelectric conversion device includes an amplifier circuit which amplifies output of the photodiode. Various circuit configurations can be applied to the amplifier circuit. In this embodiment, a current mirror circuit is formed using a plurality of thin film transistors. Any photodiode can be used as long as it has a pn junction, a pin junction, or a function equal to the junction. An anode (a p-layer side) of the photodiode is connected to a drain terminal of the thin film transistor. A cathode (an n-layer side) of the photodiode is connected to an output terminal.

When the photodiode is irradiated with light, photocurrent flows from the cathode (the n-layer side) to the anode (the p-layer side). Accordingly, current flows through the thin film transistor of the amplifier circuit, and voltage which is necessary for flowing the current is generated in a gate.

Further, by using a gate insulating film formed using a high-density plasma apparatus, the gate insulating film can be thinned.

This embodiment can be freely combined with any of Embodiment Mode, Embodiment 1, and Embodiment 2.

Embodiment 5

In this embodiment, an example of manufacturing a semiconductor device in which a memory element is formed over the same substrate as a capacitor and a transistor and an antenna circuit is provided is described with reference to FIGS. 15A to 15C.

First, island-shaped semiconductor films 503a, 503b, 603a, and 603b are formed over one surface of a substrate 501 with an insulating film 502 interposed therebetween. Note that the semiconductor film 503a is included in a memory element which is to be formed later; the semiconductor film 503b is included in a capacitor which is to be formed later; and the semiconductor films 603a and 603b are included in thin film transistors which are to be formed later.

Next, an insulating film 504 is formed so as to cover the semiconductor films 503a, 503b, 603a, and 603b. As for the insulating film 504, after an insulating film having a thickness of 10 nm is formed using a high-density plasma apparatus, plasma treatment is performed using the high-density plasma apparatus. After that, a conductive film is formed so as to cover the insulating film 504.

Note that in order to control the threshold voltage or the like, an impurity element may be introduced into the semiconductor films 503a, 603a, and 603b at low concentration in advance. In this case, the impurity element is also introduced into regions which serve as channel formation regions in the semiconductor films 503a, 603a, and 603b later. As the impurity element, an impurity element which imparts n-type conductivity or an impurity element which imparts p-type conductivity can be used. As an impurity element which imparts n-type conductivity, phosphorus (P), arsenic (As), or the like can be used. As an impurity element which imparts p-type conductivity, boron (B), aluminum (Al), gallium (Ga), or the like can be used. Here, as the impurity element, boron (B) is introduced into the entire surface of the semiconductor films

503a, 603a, and 603b in advance so that boron is contained at a concentration higher than or equal to $5\times10^{15}/cm^3$ and lower than or equal to $5\times10^{17}/cm^3$.

Next, after the conductive film provided above the semiconductor films 603a and 603b are selectively removed, the insulating film which is exposed is also selectively removed (see FIG. 15A). Note that above the semiconductor films 503a and 503b, a conductive film 505 and the insulating film 504 are left.

Next, a resist is selectively formed over the left conductive film 505 so as to cover the semiconductor films 603a and 603b. After that, the left conductive film 505 is further etched selectively using the resist as a mask so that the conductive films 505a and 505b are left over the semiconductor films 503a and 503b, respectively. Subsequently, an impurity element is introduced into the semiconductor films 503a and 503b by using the resist as a mask to form impurity regions 507 in the semiconductor films 503a and 503b.

As the impurity element which is introduced, an impurity element which imparts n-type conductivity or an impurity element which imparts p-type conductivity is used. As the impurity element which imparts n-type conductivity, phosphorus (P), arsenic (As), or the like can be used. As the impurity element which imparts p-type conductivity, boron (B), aluminum (Al), gallium (Ga), or the like can be used. Here, the case is described in which phosphorus (P) is introduced into the semiconductor films 503a and 503b to form n-type impurity regions as the impurity regions 507.

Next, after the resist is removed, an insulating film 508 is formed so as to cover the semiconductor films 603a and 603b and the conductive films 505a and 505b. As for the insulating film 508, after an insulating film having a thickness of 40 nm is formed using a high-density plasma apparatus, plasma treatment is performed using the high-density plasma apparatus. After that, a conductive film is formed over the insulating film 508.

Next, resists 510 are selectively formed over the conductive films, and the conductive films are selectively etched using the resists 510 as masks so that conductive films 509a, 609a, and 609b are left over the semiconductor film 503a, 603a, and 603b, respectively. The conductive film formed over the semiconductor film 503b is removed (see FIG. 15B).

Next, after the resists 510 are removed, a resist is formed so as to cover the semiconductor films 503a and 603b, and an impurity element is introduced into the semiconductor films 603a and 503b by using the resist and the conductive film 609a as masks. As for the semiconductor film 603a, an impurity element is introduced into a region which does not overlap with the conductive film 609a to form impurity regions 611. An impurity element is introduced into the entire part of the semiconductor film 503b through the conductive film 505b to form impurity regions 512b and an impurity region 512a which overlaps with the conductive film 505b.

As the impurity element which is introduced, an impurity element which imparts n-type conductivity or an impurity element which imparts p-type conductivity is used. Here, the case is described in which an element (an element which is small in mass) such as boron (B), which is an impurity element imparting p-type conductivity, is introduced into the semiconductor films 603a and 503b at high concentration to form the impurity regions 611, 512a, and 512b to which the impurity element which imparts p-type conductivity is added. In the case where the impurity element is introduced into the semiconductor film 503b through the insulating film 508, the conductive film 505, and the insulating film 504, damage to the insulating film 504 can be reduced by using an element (an element which is small in mass) such as boron (B).

Next, after the resist is removed, a resist is formed so as to cover the semiconductor films 503b and 603a, and an impurity element is introduced into the semiconductor films 503a and 603b by using the resist and the conductive films 509a and 609b as masks. As for the semiconductor film 503a, an impurity element is introduced into a region which does not overlap with the conductive film 509a to form impurity regions 511. As for the semiconductor film 603b, an impurity element is introduced into a region which does not overlap with the conductive film 609b to form impurity regions 612.

As the impurity element which is introduced, an impurity element which imparts n-type conductivity or an impurity element which imparts p-type conductivity is used. Here, the case is described in which phosphorus (P) is introduced into the semiconductor films 503a and 603b at high concentration to form the n-type impurity regions 511 and 612.

Next, an insulating film 513 is formed so as to cover the insulating film 508 and the conductive films 509a, 609a, and 609b. After that, conductive films 514 which are electrically connected to the impurity regions 511 in the semiconductor film 503a, the impurity regions 512b in the semiconductor film 503b, the impurity regions 611 in the semiconductor film 603a, and the impurity regions 612 in the semiconductor film 603b are formed.

Through the above steps, a semiconductor device including a memory element 520, a capacitor 521, and thin film transistors 620 and 621 can be obtained.

Subsequently, an insulating film 702 is formed so as to cover the insulating film 513 and the conductive film 514, and a conductive film 703 which functions as an antenna is formed over the insulating film 702 (see FIG. 15C).

The insulating film 702 is formed using an inorganic material such as silicon oxide or silicon nitride, an organic material such as polyimide, polyamide, benzocyclobutene, acrylic, epoxy, or siloxane, or the like by sputtering, CVD, SOQ a droplet discharge method, or the like.

The conductive film 703 is formed using a conductive material by CVD, sputtering, a printing method such as screen printing or gravure printing, a droplet discharge method, a dispenser method, a metal plating method, or the like. The conductive material is formed having a single-layer structure or a layered structure of an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material which contains any of the above elements as its main component.

Through the above steps, a wireless chip can be manufactured.

In addition, by using the insulating film 504 formed using the high-density plasma apparatus, the capacitance of the capacitor 521 can be increased, so that data writing or data erasing of the memory element 520 can be performed at low power consumption. Further, by using the insulating film 508 formed using the high-density plasma apparatus, the driver circuit including the thin film transistors 620 and 621 can be operated at high speed.

In this embodiment, an example in which the thickness of the insulating film 504 is 10 nm and the thickness of the insulating film 508 is 40 nm is illustrated; however, the thickness of the insulating film 504 and the thickness of the insulating film 508 are not particularly limited to these thicknesses. It is acceptable as long as each of the insulating film 504 and the insulating film 508 is formed to a thickness greater than 10 nm and less than 100 nm.

This embodiment can be freely combined with Embodiment Mode.

Embodiment 6

According to Embodiment Mode, a semiconductor device which serves as a chip having an integrated circuit (hereinafter also referred to as a processor chip, a wireless chip, a wireless processor, a wireless memory, or a wireless tag) can be formed. The application range of a semiconductor device obtained by the manufacturing method of Embodiment Mode is wide. For example, the semiconductor device can be applied to bills, coins, securities, certificates, bearer bonds, packaging containers, books, recording media, personal belongings, vehicles, food, clothing, healthcare products, livingware, medicines, electronic devices, or the like.

For example, by forming an integrated circuit having a TFT in accordance with Embodiment 1 or Embodiment 5, a wireless chip can be manufactured.

Figure 16A:
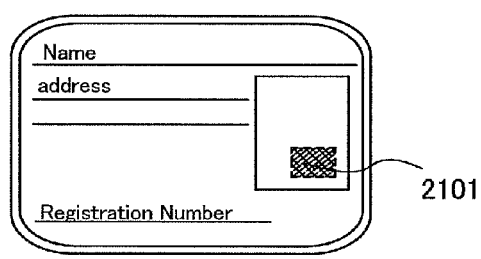
FIGS. 16A to 16E are diagrams illustrating examples of electronic devices.

Bills and coins refer to money that circulates in the market and also refer to currency that (cash voucher) can be used in the same way as money in a specific area, commemorative coins, and the like. Securities refer to checks, certificates, promissory notes, and the like, for which a wireless chip can be provided. Certificates refer to driver's licenses, resident's cards, and the like, for which a wireless chip 2101 can be provided (see FIG. 16A).

Figure 16B:
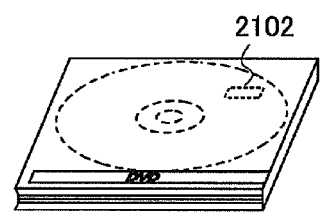

Personal belongings refer to bags, glasses, and the like, for which a wireless chip can be provided. Bearer bonds refer to stamps, rice coupons, various merchandise coupons, and the like. Packaging container refer to wrapping paper for food containers and the like, plastic bottles, and the like, for which a wireless chip can be provided. Books refer to hardbacks, paperbacks, and the like, for which a wireless chip can be provided. Recording media refer to DVD software, video tapes, and the like, for which a wireless chip 2102 can be provided (see FIG. 16B).

Food refers to groceries, beverages, and the like. Clothing refers to clothes, shoes, and the like. Healthcare products refer to medical apparatuses, health appliances, and the like. Livingware refers to furniture, lighting apparatuses, and the like. Medicines refer to drugs, agricultural chemicals, and the like. Electronic devices refer to liquid crystal display devices, EL display devices, television sets (television receivers and thin television receivers), mobile phones, and the like.

The semiconductor device obtained by the manufacturing method of Embodiment Mode is fixed to an article by being mounted on a printed circuit board, by being attached to a surface of the article, or by being embedded in the article, for example. For example, the semiconductor device is fixed to an article by being embedded in paper in the case of a book, or by being embedded in an organic resin in the case of a package formed using the organic resin. Since the semiconductor device obtained by the manufacturing method of Embodiment Mode can be made compact, thin, and lightweight, the design of the article itself is not damaged even after the semiconductor device is fixed to the article. In addition, by providing the semiconductor device obtained by the manufacturing method of Embodiment Mode in paper money, coins, securities, bearer bonds, certificates, or the like, an authentication function can be provided. By utilizing this authentication function, falsification can be prevented.

Figure 16C:
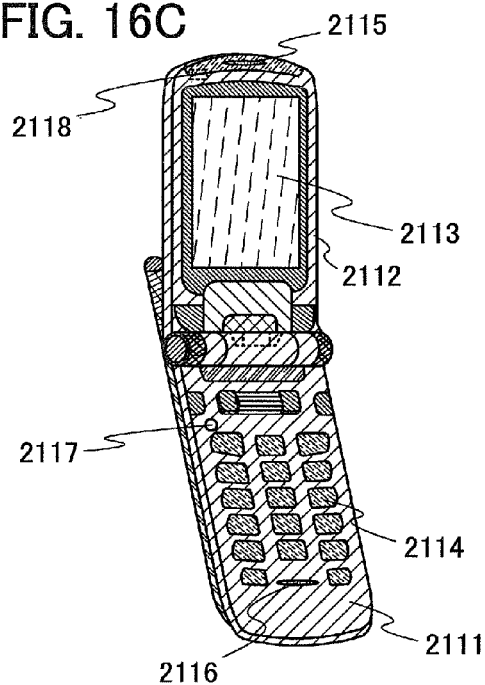

Further, FIG. 16C illustrates an example in which a semiconductor device which can be obtained by the manufacturing method of Embodiment Mode is used for a mobile phone. In FIG. 16C, a main body 2111 includes a housing 2112, a display panel 2113, operation keys 2114, an audio output portion 2115, an audio input portion 2116, and photoelectric conversion devices 2117 and 2118. For example, the photoelectric conversion devices 2117 and 2118 can be obtained in accordance with Embodiment 4.

In a mobile phone illustrated in FIG. 16C, the luminance of the display panel 2113 and the operation keys 2114 can be controlled by detecting external light with the photoelectric conversion device 2117 provided in the main body 2111. In addition, the photoelectric conversion device 2118 is provided inside the main body 2111. With the photoelectric conversion device 2118, the luminance of a backlight which is provided in the display panel 2113 can also be detected. Since the photoelectric conversion device including a circuit which amplifies photocurrent to be extracted as voltage output is provided in the cellular phone, the number of components mounted on a circuit board can be reduced, so that the mobile phone itself can be made smaller. Further, since the circuit and the photoelectric conversion device can be formed over the same substrate, noise can be reduced.

Further, in the case of using a liquid crystal panel as the display panel 2113, the mobile phone illustrated in FIG. 16C can be obtained in accordance with Embodiment 2.

Alternatively, in the case of using a light-emitting display panel as the display panel 2113, the mobile phone illustrated in FIG. 16C can be obtained in accordance with Embodiment 3.

Figure 16D:
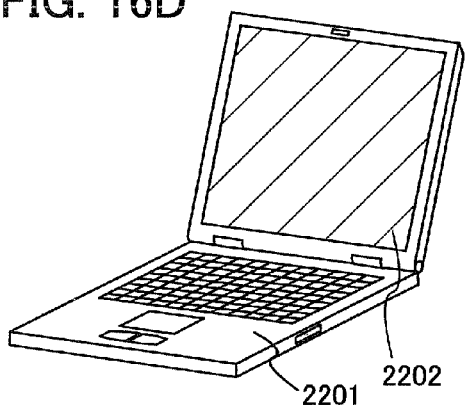

In addition, a mobile computer illustrated in FIG. 16D includes a main body 2201, a display portion 2202, and the like. By applying the display device illustrated in Embodiment 2 or Embodiment 3 to the display portion 2202, power consumption can be reduced.

Figure 16E:
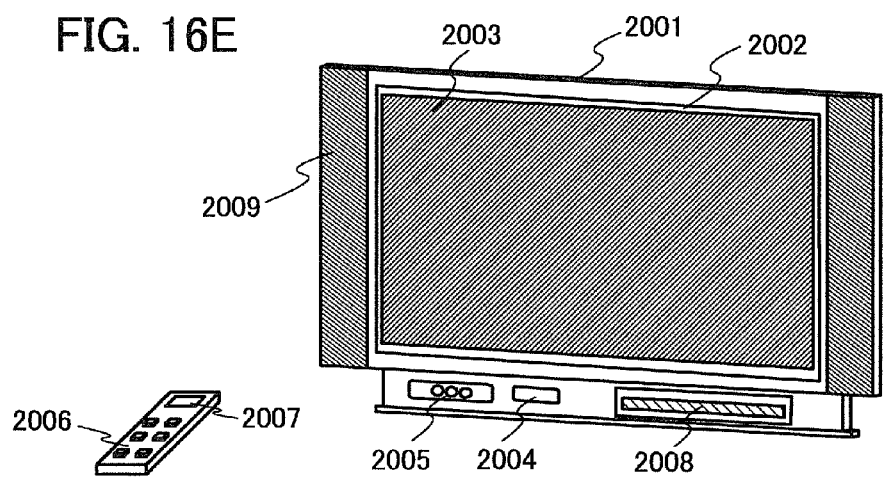

Further, FIG. 16E illustrates a television set. By incorporating the display device illustrated in Embodiment 2 or Embodiment 3 into a housing as illustrated in FIG. 16E, the television set can be completed. A display panel provided with components up to an FPC is also referred to as a display module. A main screen 2003 is formed using a display module, and a speaker portion 2009, operating switches, and the like are provided as its accessory equipment. In this manner, the television set can be completed.

As illustrated in FIG. 16E, a display panel 2002 using a display element is incorporated into a housing 2001. When a receiver 2005 is used, including reception of general TV broadcast, communication of information can also be performed in one way (from a transmitter to a receiver) or in two ways (between a transmitter and a receiver or between receivers) by connection to a wired or wireless communication network through a modem 2004. The television set can be operated by switches incorporated into the housing or by a remote controller 2006 separated from the main body. A display portion 2007 for displaying information to be output may also be provided in this remote controller.

In addition, in the television set, a structure for displaying a channel, sound volume, or the like may be added by forming a subscreen 2008 with a second display panel in addition to the main screen 2003. In this structure, the main screen 2003 may be formed using the liquid crystal display panel illustrated in Embodiment 2, and the subscreen 2008 may be formed using the light-emitting display panel capable of displaying images with low power consumption. Alternatively, in order to prioritize low power consumption, a structure in which the main screen 2003 is formed using a light-emitting display panel, the subscreen 2008 is formed using an light-emitting display panel, and the subscreen 2008 can flash on and off may be used.

Needless to say, the semiconductor device obtained by the manufacturing method of Embodiment Mode is not limited to the television set, and can be applied to various uses as a large display medium such as an information display board at a train station, an airport, or the like, or an advertisement display board on the street, as well as a monitor of a personal computer.

An insulating film having uniform thickness can be formed over a glass substrate that is a large-area substrate, and manufacturing cost per semiconductor device can be reduced.

This application is based on Japanese Patent Application serial no. 2008-029086 filed with Japan Patent Office on Feb. 8, 2008, the entire contents of which are hereby incorporated by reference.

What is claimed is:

1. A method for manufacturing a semiconductor device, comprising the steps of:
   forming an insulating film over a substrate by using monosilane and nitrous oxide as a source gas while supplying microwaves in a processing container; and
   performing nitrous oxide plasma treatment on the insulating film while supplying microwaves in the processing container.

2. The method for manufacturing a semiconductor device according to claim 1, wherein the substrate has an insulating surface.

3. A method for manufacturing a semiconductor device, comprising the steps of:
   generating a plasma in a processing container by supplying microwaves;
   supplying monosilane and nitrous oxide as a source gas to the processing container while supplying microwaves thereby forming an insulating film over a substrate;
   stopping supplying the source gas and generating the plasma;
   supplying a rare gas as a plasma ignition gas to the processing container, after stopping supplying the source gas and generating the plasma;
   controlling a pressure in the processing container; and
   generating a plasma in the processing container by supplying microwaves, after supplying the rare gas as the plasma ignition gas, thereby performing nitrous oxide plasma treatment on the insulating film in the processing container.

4. The method for manufacturing a semiconductor device according to claim 3, wherein the substrate has an insulating surface.

5. A method for manufacturing a semiconductor device, comprising the steps of:
   forming a semiconductor layer over a substrate;
   forming an insulating film covering the semiconductor layer by using monosilane and nitrous oxide as a source gas while supplying microwaves in a processing container;
   performing nitrous oxide plasma treatment on the insulating film while supplying microwaves in the processing container;
   adding an impurity element imparting one conductivity type to the semiconductor layer through the insulating film; and
   forming a metal electrode over the insulating film.

6. The method for manufacturing a semiconductor device according to claim 5, wherein the substrate has an insulating surface.

7. The method for manufacturing a semiconductor device according to claim 5, wherein the semiconductor layer is formed by irradiating an amorphous semiconductor film over the substrate with laser light.

8. The method for manufacturing a semiconductor device according to claim 5, wherein the semiconductor layer is formed by separating a part of a semiconductor substrate, fixing the part of the semiconductor substrate to the substrate, and selectively etching the part of the semiconductor substrate.

9. The method for manufacturing a semiconductor device according to claim 5, wherein the impurity element imparting one conductivity type is boron.

10. The method for manufacturing a semiconductor device according to claim 5, wherein the impurity element imparting one conductivity type is phosphorus.

11. The method for manufacturing a semiconductor device according to claim 5, wherein the semiconductor layer, the insulating film, and the metal electrode overlap with each other to serve as a capacitor.

12. A method for manufacturing a semiconductor device, comprising the steps of:
   forming a first semiconductor layer and a second semiconductor layer over a substrate;
   forming an insulating film covering the first semiconductor layer and the second semiconductor layer by using monosilane and nitrous oxide as a source gas while supplying microwaves in a processing container;
   performing nitrous oxide plasma treatment on the insulating film while supplying microwaves in the processing container;
   adding an impurity element imparting one conductivity type to the first semiconductor layer through the insulating film;
   forming a metal electrode over the insulating film overlapping with the first semiconductor layer;
   forming a gate electrode over the insulating film overlapping with the second semiconductor layer;
   forming an interlayer insulating film covering the metal electrode and the gate electrode; and
   forming a source electrode and a drain electrode electrically connected to the second semiconductor layer over the interlayer insulating film.

13. The method for manufacturing a semiconductor device according to claim 12, wherein the substrate has an insulating surface.

14. The method for manufacturing a semiconductor device according to claim 12, wherein the first semiconductor layer and the second semiconductor layer are formed by irradiating an amorphous semiconductor film over the substrate with laser light.

15. The method for manufacturing a semiconductor device according to claim 12, wherein the first semiconductor layer and the second semiconductor layer are formed by separating a semiconductor layer from a semiconductor substrate, fixing the semiconductor layer to the substrate, and selectively etching the semiconductor layer.

16. The method for manufacturing a semiconductor device according to claim 12,
   wherein the first semiconductor layer, the insulating film, and the metal electrode overlap with each other to serve as a capacitor.

17. The method for manufacturing a semiconductor device according to claim 1, wherein the substrate is a glass substrate.

18. The method for manufacturing a semiconductor device according to claim 3, wherein the substrate is a glass substrate.

19. The method for manufacturing a semiconductor device according to claim 1, wherein the microwaves are supplied through a plurality of dielectric plates.

20. The method for manufacturing a semiconductor device according to claim 3, wherein the microwaves are supplied through a plurality of dielectric plates.

21. The method for manufacturing a semiconductor device according to claim 1, wherein the nitrous oxide is supplied from a gas pipe using ceramics.

22. The method for manufacturing a semiconductor device according to claim 3, wherein the nitrous oxide is supplied from a gas pipe using ceramics.

23. The method for manufacturing a semiconductor device according to claim 3, wherein the plasma has an electron temperature higher than or equal to 0.7 eV and lower than or equal to 3 eV, and has an electron density higher than or equal to $1\times10^{11}$ cm$^{-3}$ and lower than or equal to $1\times10^{13}$ cm$^{-3}$.

* * * * *